United States Patent
Su et al.

(10) Patent No.: US 12,520,701 B2
(45) Date of Patent: Jan. 6, 2026

(54) ORGANIC LIGHT EMITTING DIODE DISPLAY SUBSTRATE, MANUFACTURING METHOD THEREOF, AND ORGANIC LIGHT EMITTING DIODE DISPLAY DEVICE

(71) Applicants: Hefei Xinsheng Optoelectronics Technology Co., Ltd., Anhui (CN); BOE Technology Group Co., Ltd., Beijing (CN)

(72) Inventors: Tongshang Su, Beijing (CN); Bin Zhou, Beijing (CN); Jun Cheng, Beijing (CN); Qinghe Wang, Beijing (CN); Ning Liu, Beijing (CN); Jun Wang, Beijing (CN); Dacheng Zhang, Beijing (CN); Liangchen Yan, Beijing (CN)

(73) Assignees: Hefei Xinsheng Optoelectronics Technology Co., Ltd., Anhui (CN); BOE Technology Group Co., Ltd., Beijing (CN)

( * ) Notice: Subject to any disclaimer, the term of this patent is extended or adjusted under 35 U.S.C. 154(b) by 409 days.

(21) Appl. No.: 17/633,588

(22) PCT Filed: Apr. 21, 2021

(86) PCT No.: PCT/CN2021/088754
§ 371 (c)(1),
(2) Date: Feb. 8, 2022

(87) PCT Pub. No.: WO2022/222070
PCT Pub. Date: Oct. 27, 2022

(65) Prior Publication Data
US 2023/0363241 A1    Nov. 9, 2023

(51) Int. Cl.
*H10K 59/80*    (2023.01)
*H10K 59/12*    (2023.01)
(Continued)

(52) U.S. Cl.
CPC ... *H10K 59/80522* (2023.02); *H10K 59/1201* (2023.02); *H10K 59/1216* (2023.02);
(Continued)

(58) Field of Classification Search
CPC ........ H10K 59/80522; H10K 59/1216; H10K 59/122; H10K 59/126; H10K 71/621;
(Continued)

(56) References Cited

U.S. PATENT DOCUMENTS 6,635,990 B1 * 10/2003 Pichler .................. H10K 59/60
313/506
10,566,407 B2    2/2020 Lee et al.
(Continued)

FOREIGN PATENT DOCUMENTS

CN    104733500 A    6/2015
CN    106206645 A    12/2016
(Continued)

OTHER PUBLICATIONS

Office Action dated May 21, 2025 for CN202180000852.9 and English Translation.

*Primary Examiner* — Chad M Dicke
*Assistant Examiner* — Jeremy Daniel Watts
(74) *Attorney, Agent, or Firm* — Ling Wu; Stephen Yang; Ling and Yang Intellectual Property

(57) ABSTRACT

The present disclosure provides a display substrate, a manufacturing method thereof and a display device. The present disclosure includes a driving circuit layer disposed on a substrate and a light emitting structure layer disposed at one side of the driving circuit layer away from the substrate, wherein the light emitting structure layer includes an anode, an organic light emitting layer, an organic light emitting block, a cathode and an auxiliary electrode, the organic light emitting layer is connected to the anode and the cathode
(Continued)

respectively, the auxiliary electrode includes a bottom surface at one side close to the substrate, a top surface at a side away from the substrate and a side surface arranged between the bottom surface and the top surface.

13 Claims, 12 Drawing Sheets

(51) Int. Cl.
| | |
|---|---|
| *H10K 59/121* | (2023.01) |
| *H10K 59/122* | (2023.01) |
| *H10K 59/126* | (2023.01) |
| *H10K 59/131* | (2023.01) |
| *H10K 71/00* | (2023.01) |

(52) U.S. Cl.
CPC ......... *H10K 59/122* (2023.02); *H10K 59/126* (2023.02); *H10K 59/131* (2023.02); *H10K 59/80517* (2023.02); *H10K 59/80516* (2023.02); *H10K 71/00* (2023.02)

(58) Field of Classification Search
CPC ........... H10K 59/80517; H10K 50/824; H10K 50/816; H10K 59/1201; H10K 59/131; H10K 59/80516; H10K 71/00
See application file for complete search history.

(56) References Cited

U.S. PATENT DOCUMENTS

| | | | | |
|---|---|---|---|---|
| 2012/0161167 | A1* | 6/2012 | Yamazaki | H10K 59/86 438/34 |
| 2015/0179719 | A1 | 6/2015 | Nam et al. | |
| 2016/0149155 | A1* | 5/2016 | Kim | H10K 59/124 438/23 |
| 2016/0351636 | A1 | 12/2016 | Lee et al. | |
| 2016/0351638 | A1* | 12/2016 | Im | H10K 59/87 |
| 2018/0061908 | A1 | 3/2018 | Shim et al. | |
| 2018/0151647 | A1* | 5/2018 | Lee | H10K 59/80522 |
| 2019/0165305 | A1 | 5/2019 | Zhang | |
| 2019/0207168 | A1 | 7/2019 | Lee et al. | |
| 2019/0229152 | A1 | 7/2019 | Wang | |
| 2021/0028249 | A1 | 1/2021 | Ding et al. | |
| 2021/0233979 | A1 | 7/2021 | Ma et al. | |
| 2021/0327908 | A1* | 10/2021 | Liu | H10D 86/481 |
| 2021/0336187 | A1* | 10/2021 | Tang | H10K 59/80522 |
| 2021/0359279 | A1* | 11/2021 | Cai | H10K 59/123 |
| 2022/0093894 | A1* | 3/2022 | Song | H10K 59/1201 |
| 2022/0223669 | A1* | 7/2022 | Takayama | H10K 59/122 |
| 2022/0352275 | A1* | 11/2022 | Zhang | H10K 59/124 |
| 2023/0109576 | A1* | 4/2023 | Uchida | H10K 59/122 257/89 |
| 2023/0189570 | A1* | 6/2023 | Lin | H10K 59/80521 257/40 |

FOREIGN PATENT DOCUMENTS

| | | | | |
|---|---|---|---|---|
| CN | 108010943 | A | 5/2018 | |
| CN | 109935621 | A | 6/2019 | |
| CN | 110085648 | A | 8/2019 | |
| CN | 110265583 | A | 9/2019 | |
| CN | 110402496 | A | 11/2019 | |
| CN | 111211243 | A | 5/2020 | |
| CN | 111293155 | A | 6/2020 | |
| CN | 111625145 | A | 9/2020 | |
| CN | 112103326 | A | 12/2020 | |
| CN | 112310159 | A | 2/2021 | |
| EP | 3098853 | A1 * | 11/2016 | ......... H01L 27/2346 |
| IN | 106206646 | A | 12/2016 | |
| KR | 1020170078168 | A | 7/2017 | |
| KR | 1020170078969 | A | 7/2017 | |

* cited by examiner

ORGANIC LIGHT EMITTING DIODE DISPLAY SUBSTRATE, MANUFACTURING METHOD THEREOF, AND ORGANIC LIGHT EMITTING DIODE DISPLAY DEVICE

CROSS-REFERENCE TO RELATED APPLICATION

The present application is a U.S. National Phase Entry of International Application No. PCT/CN2021/088754 having an international filing date of Apr. 21, 2021. The above-identified application is hereby incorporated by reference.

TECHNICAL FIELD

The present disclosure relates to, but is not limited to, the field of display technology, and more particularly, to a display substrate, a manufacturing method thereof, and a display device.

BACKGROUND

An Organic Light Emitting Diode (OLED), which is an active light emitting display device, has the advantages of self-luminescence, wide angle of view, high contrast, low power consumption, extremely high response speed, light weight and thinness, flexibility, low cost, etc. With the continuous development of display technology, flexible display devices in which OLEDs are used as light emitting devices and signals are controlled by thin film transistors (TFTs) have become mainstream products in the field of display at present.

SUMMARY

The following is a summary about the subject matter described herein in detail. The summary is not intended to limit the protection scope of the claims.

The present disclosure provides a display substrate, which includes a driving circuit layer disposed on a substrate and a light emitting structure layer disposed at one side of the driving circuit layer away from the substrate, wherein the light emitting structure layer includes an anode, an organic light emitting layer, an organic light emitting block, a cathode and an auxiliary electrode, the organic light emitting layer is connected to the anode and the cathode respectively, the auxiliary electrode includes a bottom surface at one side close to the substrate, a top surface at a side away from the substrate and a side surface arranged between the bottom surface and the top surface, the cathode is in contact with the side surface of the auxiliary electrode, the organic light emitting block is arranged on a side of the top surface of the auxiliary electrode away from the substrate, and the organic light emitting block is arranged to be isolated from the organic light emitting layer.

In an exemplary implementation, in a plane perpendicular to the display substrate, the auxiliary electrode includes a first auxiliary electrode, a second auxiliary electrode disposed at one side of the first auxiliary electrode away from the substrate, and a third auxiliary electrode disposed at one side of the second auxiliary electrode away from the substrate, an orthographic projection of the second auxiliary electrode on the substrate is within an orthographic projection of the first auxiliary electrode on the substrate, and the orthographic projection of the second auxiliary electrode on the substrate is within an orthographic projection of the third auxiliary electrode on the substrate.

In an exemplary implementation, the organic light emitting block is disposed on the same layer and is made of the same materials as the organic light emitting layer, the organic light emitting block is disposed at one side of the third auxiliary electrode away from the substrate, and an orthographic projection of the organic light emitting block on the substrate is within the orthographic projection of the third auxiliary electrode on the substrate.

In an exemplary implementation, the cathode is in contact with one side of the organic light emitting block away from the substrate, with the second auxiliary electrode and with the third auxiliary electrode.

In an exemplary implementation, the second auxiliary electrode includes a second side surface, a normal direction of which is parallel or nearly parallel to a plane of the substrate, the third auxiliary electrode includes a third lower surface protruding from the second auxiliary electrode and at one side close to the substrate, and includes a third side surface, a normal direction of which is parallel or nearly parallel to the plane of the substrate, and the organic light emitting block includes a fourth upper surface at one side away from the substrate and a fourth side surface, a normal direction of which is parallel or nearly parallel to the plane of the substrate; the cathode overlies or partially overlies the second side surface, the cathode overlies or partially overlies the third lower surface and the third side surface, and the cathode overlies or partially overlies the fourth upper surface and the fourth side surface.

In an exemplary implementation, materials of the second auxiliary electrode include any one or more of silver, copper, aluminum, titanium and molybdenum, or alloy materials of the aforementioned metals, and materials of the first auxiliary electrode and the third auxiliary electrode include any one or more of indium tin oxide and indium zinc oxide.

In an exemplary implementation, the anode includes a first anode, a second anode arranged at one side of the first anode away from the substrate, and a third anode arranged at one side of the second anode away from the substrate, an orthographic projection of the second anode on the substrate is within an orthographic projection of the first anode on the substrate, and the orthographic projection of the second anode on the substrate is within an orthographic projection of the third anode on the substrate.

In an exemplary implementation, the first anode is arranged on the same layer and is made of the same materials as the first auxiliary electrode; the second anode is arranged on the same layer and is made of the same materials as the second auxiliary electrode; the third anode is arranged on the same layer and is made of the same materials as the third auxiliary electrode.

In an exemplary implementation, the light emitting structure layer further includes a pixel define layer overlying at least one portion of the first auxiliary electrode, a first pixel opening and a second pixel opening are provided in the pixel define layer, the first pixel opening exposes part of a surface of the third anode, and the second pixel opening exposes the second auxiliary electrode and the third auxiliary electrode.

In an exemplary implementation, in the plane perpendicular to the display substrate, the driving circuit layer includes a first conducting layer, a semiconductor layer, a second conducting layer and a third conducting layer which are disposed sequentially on the substrate, wherein the first conducting layer at least includes a shielding layer, the semiconductor layer at least includes a first capacitor polar plate and active layers of a plurality of transistors, the second conducting layer at least includes gate electrodes of the plurality of transistors, and the third conducting layer at least includes a second power line, a second capacitor polar plate and first electrodes and second electrodes of the plurality of transistors.

In an exemplary implementation, the second capacitor polar plate is connected to the shielding layer through via holes, the second capacitor polar plate and the first capacitor polar plate form a first storage capacitor, and the shielding layer and the first capacitor polar plate form a second storage capacitor; the first auxiliary electrode in the auxiliary electrode is connected to the second power line through electrode via holes, and the first anode in the anode is connected to the second capacitor polar plate through anode via holes.

In an exemplary implementation, in a plane parallel to the display substrate, the display substrate includes a plurality of pixel units, which are arranged sequentially along a first direction and a second direction, respectively, the first direction intersecting the second direction; the plurality of pixel units includes at least one first pixel unit and a second pixel unit adjacent to the first pixel unit in the first direction; the auxiliary electrode is arranged between the first pixel unit and the second pixel unit.

In an exemplary implementation, the first pixel unit includes a first sub-pixel, a second sub-pixel and a third sub-pixel arranged sequentially along the first direction, and the second pixel unit includes a first sub-pixel, a second sub-pixel and a third sub-pixel arranged sequentially along a direction opposite to the first direction; the auxiliary electrode is arranged between the third sub-pixel of the first pixel unit and the third sub-pixel of the second pixel unit.

In an exemplary implementation, in the second direction, the anode of the third sub-pixel in the first pixel unit has a first end and a second end, and the anode of the third sub-pixel in the second pixel unit has a third end and a fourth end; a size of the first end in the first direction is smaller than a size of the second end in the first direction, and a size of the third end in the first direction is smaller than a size of the fourth end in the first direction.

In an exemplary implementation, in the first direction, a distance between the second end and the second pixel unit is smaller than a distance between the first end and the second pixel unit, a distance between the fourth end and the first pixel unit is smaller than a distance between the third end and the first pixel unit, and the auxiliary electrode is arranged between the first end and the third end.

The present disclosure further provides a display device, which includes the aforementioned display substrate.

The present disclosure further provides a method for manufacturing a display substrate, which includes:
forming a driving circuit layer on a substrate; and
forming a light emitting structure layer on the driving circuit layer, wherein the light emitting structure layer includes an anode, an organic light emitting layer, an organic light emitting block, a cathode and an auxiliary electrode, the organic light emitting layer is connected to the anode and the cathode respectively, the auxiliary electrode includes a bottom surface at one side close to the substrate, a top surface at a side away from the substrate and a side surface arranged between the bottom surface and the top surface, the cathode is in contact with the side surface of the auxiliary electrode, the organic light emitting block is arranged on a side of the top surface of the auxiliary electrode away from the substrate, and the organic light emitting block is arranged to be isolated from the organic light emitting layer.

After the drawings and the detailed description are read and understood, the other aspects may become clear.

BRIEF DESCRIPTION OF DRAWINGS

The drawings are intended to provide a further understanding of technical schemes of the present disclosure and form a part of the specification, and are used to explain the technical schemes of the present disclosure together with the embodiments of the present disclosure, and not intended to form limitations to the technical schemes of the present disclosure. The shapes and sizes of various components in the drawings do not reflect the true proportion, and are only intended to schematically illustrate the contents of the present disclosure.

Figure 1:
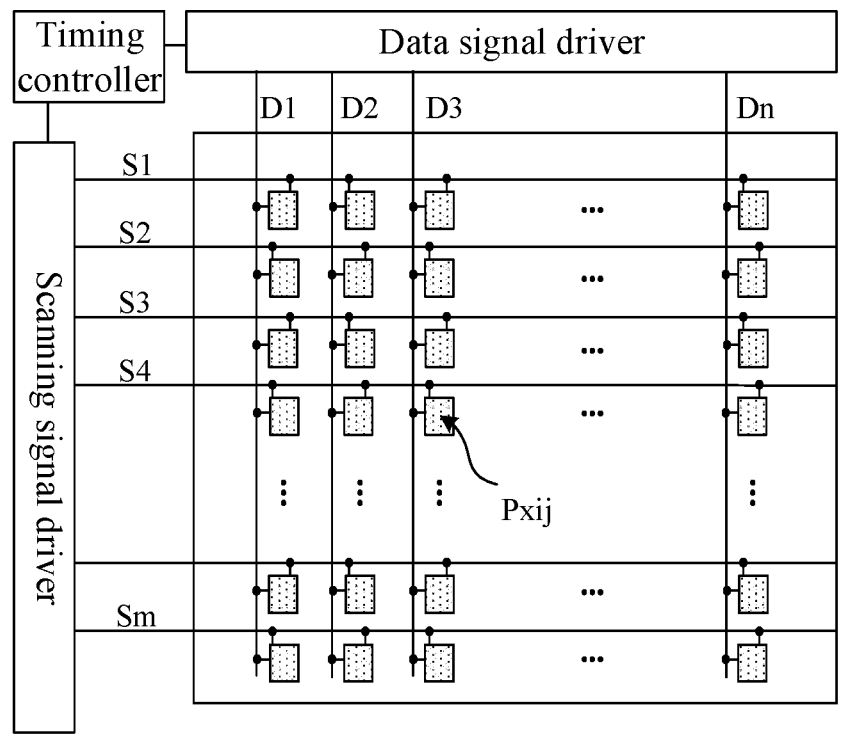
FIG. 1 is a schematic diagram of a structure of a display substrate.

| Description of reference numbers: | | |
|---|---|---|
| 10-substrate; | 11-shielding layer; | 12-power connecting line; |
| 13-compensation connecting line; | 21-first active layer; | 22-second active layer; |
| 23-third active layer; | 24-first capacitor polar plate; | 31-first scanning line |
| 32-second scanning line | 33-first protective electrode; | 34-second protective electrode; |
| 35-third protective electrode; | 36-second gate electrode; | 41-first power line; |
| 42-data Line; | 43-compensating line; | 44-second power line; |
| 45-second capacitor polar plate; | 46-first connecting electrode; | 47-second connecting electrode; |
| 48-third connecting electrode; | 50-anode; | 51-first anode; |
| 52-second anode; | 53-third anode; | 60-auxiliary electrode; |
| 61-first auxiliary electrode; | 62-second auxiliary electrode; | 63-third auxiliary electrode; |
| 71-pixel define layer; | 72-organic light emitting layer; | 73-organic light emitting block; |
| 80-cathode; | 91-first insulating layer; | 92-second insulating layer; |
| 93-third insulating layer; | 94-fourth insulating layer; | 95-planarization layer; |
| 101-transistor; | 101A-storage capacitor; | 102-driving circuit layer; |
| 103-light emitting structure layer; | 104-encapsulation layer; | 301-anode; |
| 302-pixel define layer; | 303-organic light emitting layer; | 304-cathode; |
| 401-first encapsulation layer; | 402-second encapsulation layer; | 403-third encapsulation layer. |

DETAILED DESCRIPTION

In order to make the objects, technical schemes and advantages of the present disclosure more clear, the embodiments of the present disclosure will be described in detail below in combination with the drawings. It is noted that their implementations may be carried out in many different forms. Those of ordinary skill in the art can easily understand such a fact that manners and contents may be transformed into various forms without departing from the purpose and scope of the present disclosure. Therefore, the present disclosure should not be interpreted as being limited to the contents recorded in the following implementations only. The embodiments in the present disclosure and features in the embodiments can be arbitrarily combined with each other if without conflicts.

Sometimes for clarity, sizes of various constituent elements, thicknesses of layers or areas in the drawings may be exaggerated. Therefore, one implementation of the present disclosure is not necessarily limited to the sizes, and the shapes and sizes of various components in the drawings do not reflect the true proportion. In addition, the drawings schematically illustrate ideal examples, and one implementation of the present disclosure is not limited to the shapes or numerical values shown in the drawings.

Ordinal numerals such as "first", "second", "third" and the like in the specification are set to avoid confusion of the constituent elements, but not to set a limit in quantity.

For convenience, the terms such as "middle", "upper", "lower", "front", "back", "vertical", "horizontal", "top", "bottom", "inside", "outside" and the like indicating orientation or position relationships are used in the specification to illustrate position relationships between the constituent elements with reference to the drawings, and are intended to facilitate description of the specification and simplify the description, but not to indicate or imply that the mentioned device or element must have a specific orientation or be constructed and operated in a specific orientation, therefore, they should not be understood as limitations to the present disclosure. The position relationships between the constituent elements may be appropriately changed according to directions of various constituent elements described. Therefore, words and phrases used in the specification are not limited and appropriate replacements may be made according to situations.

Unless otherwise specified and defined explicitly, the terms "installed", "coupled" and "connected" should be understood in a broad sense in the specification. For example, the connection may be a fixed connection, a detachable connection or an integrated connection, or may be a mechanical connection or an electrical connection, or may be a direct connection, an indirect connection through intermediate components, or communication inside two components. For those skilled in the art, the specific meanings of the above terms in the present disclosure can be understood according to specific situations.

In the specification, a transistor refers to a component which at least includes three terminals, a gate electrode, a drain electrode and a source electrode. The transistor has a channel region between the drain electrode (drain electrode terminal, drain region, or drain) and the source electrode (source electrode terminal, source region, or source), and a current can flow through the drain electrode, the channel region, and the source electrode. In the specification, the channel region refers to a region which the current flows mainly through.

In the specification, the first electrode may be a drain electrode, and the second electrode may be a source electrode, or the first electrode may be a source electrode, and the second electrode may be a drain electrode. In the case that transistors with opposite polarities are used or that a current direction is changed during circuit operation, functions of "the source electrode" and "the drain electrode" may sometimes be exchanged. Therefore, "the source electrode" and "the drain electrode" may be exchanged in the specification.

In the specification, "electrical connection" includes a case in which the constituent elements are connected together through an element with a certain electric action. "The element with the certain electric action" is not particularly limited as long as electric signals between the connected constituent elements can be sent and received. Examples of "the element with the certain electric action" include not only an electrode and wire, but also a switching element such as a transistor, a resistor, an inductor, a capacitor, other elements with various functions, etc.

In the specification, "parallel" refers to a state in which an angle formed by two straight lines is greater than −10° and less than 10°, and thus also includes a state in which the angle is greater than −5° and less than 5°. In addition, "vertical" refers to a state in which an angle formed by two straight lines is greater than 80° and less than 100°, and thus also includes a state in which the angle is greater than 85° and less than 95°.

In the specification, "film" and "layer" may be interchangeable. For example, sometimes "conducting layer" may be replaced by "conducting film". Similarly, sometimes "insulating film" may be replaced by "insulating layer".

"About" in the present disclosure means that a boundary is defined loosely and numerical values in process and measurement error ranges are allowed.

FIG. 1 is a schematic diagram of a structure of a display device. Referring to FIG. 1, the OLED display device may include a timing controller, a data driver, a scan driver, and a pixel array. The pixel array may include a plurality of scanning lines (S1 to Sm), a plurality of data lines (D1 to Dn), and a plurality of sub-pixels Pxij. In an exemplary implementation, the timing controller may provide gray scale values and control signals suitable for specifications of the data driver to the data driver, and may provide clock signals and scan start signals suitable for specifications of the scan driver to the scan driver. The data driver may generate data voltages, which will be provided to the data lines D1, D2, D3, . . . , Dn, using the gray scale values and the control signals received from the timing controller. For example, the data driver may sample the gray scale values using the clock signals, and apply the data voltages corresponding to the gray scale values to the data lines D1 through Dn by taking a sub-pixel row as a unit, wherein n may be a natural number. The scan driver may generate scan signals, which will be provided to the scanning lines S1, S2, S3, . . . , Sm, by receiving the clock signals and the scan start signals from the timing controller. For example, the scan driver may provide sequentially scan signals with turn-on level pulses to the scanning lines S1 through Sm. For example, the scan driver may be constructed in a form of a shift register, and may generate the scan signals by transmit sequentially the scan start signals provided in a form of a turn-on level pulse to a next-stage circuit under the control of the clock signals. Herein, m may be a natural number. An array of sub-pixels may include the plurality of sub-pixels PXij. Each of the sub-pixels PXij may be connected to the corresponding data line and the corresponding scanning line, wherein i and j may be natural numbers. The sub-pixel PXij may refer to a sub-pixel in which a transistor is connected to an $i^{th}$ scanning line and a $j^{th}$ data line.

Figure 2:
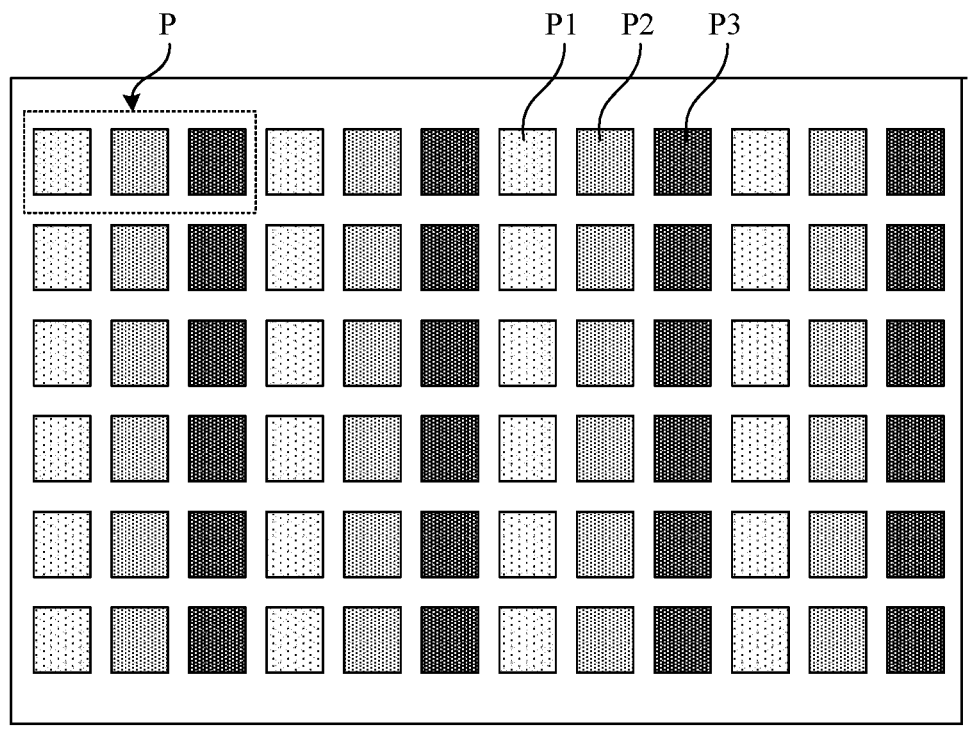
FIG. 2 is a schematic diagram of a planar structure of a display substrate.

FIG. 2 is a schematic planar structure diagram of a display substrate. As shown in FIG. 2, the display substrate may include a plurality of pixel units P arranged in a matrix. At least one of the plurality of pixel units P includes a first light emitting unit (sub-pixel) P1 that emits light of a first color, a second light emitting unit P2 that emits light of a second color and a third light emitting unit P3 that emits light of a third color. The first light emitting unit P1, the second light emitting unit P2 and the third light emitting unit P3 each include a pixel driving circuit and a light emitting device. The pixel driving circuits in the first light emitting unit P1, the second light emitting unit P2, and the third light emitting unit P3 are connected to scanning lines, data lines, and light emitting signal lines respectively. The pixel driving circuits are configured to receive data voltages transmitted by the data lines and output corresponding currents to the light emitting devices under the control of the scanning lines and the light emitting signal lines. The light emitting devices in the first light emitting unit P1, the second light emitting unit P2, and the third light emitting unit P3 are connected respectively to the pixel driving circuits of the light emitting units where the first light emitting unit P1, the second light emitting unit P2, and the third light emitting unit P3 are located, and the light emitting devices are configured to emit light of corresponding brightness in response to the currents output by the pixel driving circuits of the light emitting units in which the light emitting devices are located.

In an exemplary implementation, the pixel unit P may include red (R) light emitting units, green (G) light emitting units and blue (B) light emitting units, or may include red light emitting units, green light emitting units, blue light emitting units and white light emitting units, which is not limited herein in the present disclosure. In an exemplary implementation, shapes of the light emitting units in the pixel unit may be a rectangle, a rhombus, a pentagon, or a hexagon. When the pixel unit includes three light emitting units, the three light emitting units may be arranged in parallel horizontally, in parallel vertically, or in a shape of an equilateral triangle; when the pixel unit includes four light emitting units, the four light emitting units may be arranged in parallel horizontally, in parallel vertically, or in a shape of a square, which is not limited herein in the present disclosure.

Figure 3:
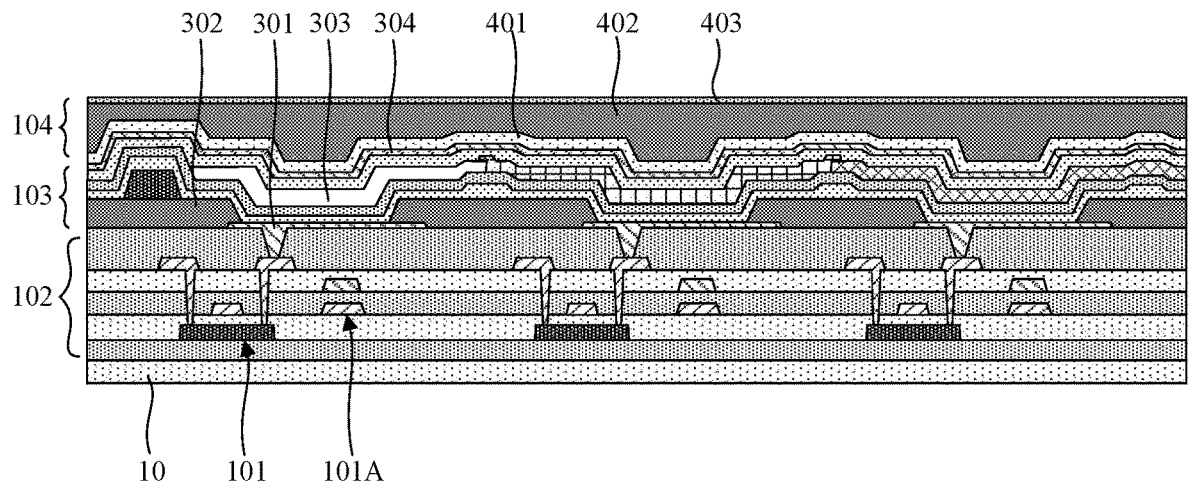
FIG. 3 is a schematic diagram of a sectional structure of a display substrate.

FIG. 3 is a schematic sectional structure diagram of a display substrate, which illustrates a structure of three sub-pixels of the OLED display substrate. Referring to FIG. 3, in a direction perpendicular to the display substrate, the display substrate may include a driving circuit layer 102 disposed on a substrate 10, a light emitting structure layer 103 disposed at one side of the driving circuit layer 102 away from the substrate 10, and an encapsulation layer 104 disposed at one side of the light emitting structure layer 103 away from the substrate 10. In some possible implementations, the display substrate may include other film layers, such as spacer posts, which is not limited herein in the present disclosure.

In an exemplary implementation, the substrate 10 may be a flexible substrate or may be a rigid substrate. The driving circuit layer 102 of each sub-pixel may include a plurality of transistors and storage capacitors, which form a pixel driving circuit. In FIG. 3, each sub-pixel including one transistor 101 and one storage capacitor 101A will be described as an example. The light emitting structure layer 103 may include an anode 301, a pixel define layer 302, an organic light emitting layer 303 and a cathode 304. The anode 301 is connected to a drain electrode of the transistor 101 through via holes, the organic light emitting layer 303 is connected to the anode 301, the cathode 304 is connected to the organic light emitting layer 303, and the organic light emitting layer 303 emits light of corresponding colors under the driving of the anode 301 and the cathode 304. The encapsulation layer 104 may include a first encapsulation layer 401, a second encapsulation layer 402, and a third encapsulation layer 403 which are stacked, wherein the first encapsulation layer 401 and the third encapsulation layer 403 may be made of inorganic materials, the second encapsulation layer 402 may be made of organic materials, and the second encapsulation layer 402 is disposed between the first encapsulation layer 401 and the third encapsulation layer 403, so as to ensure that external water vapor cannot enter the light emitting structure layer 103.

Figure 4:
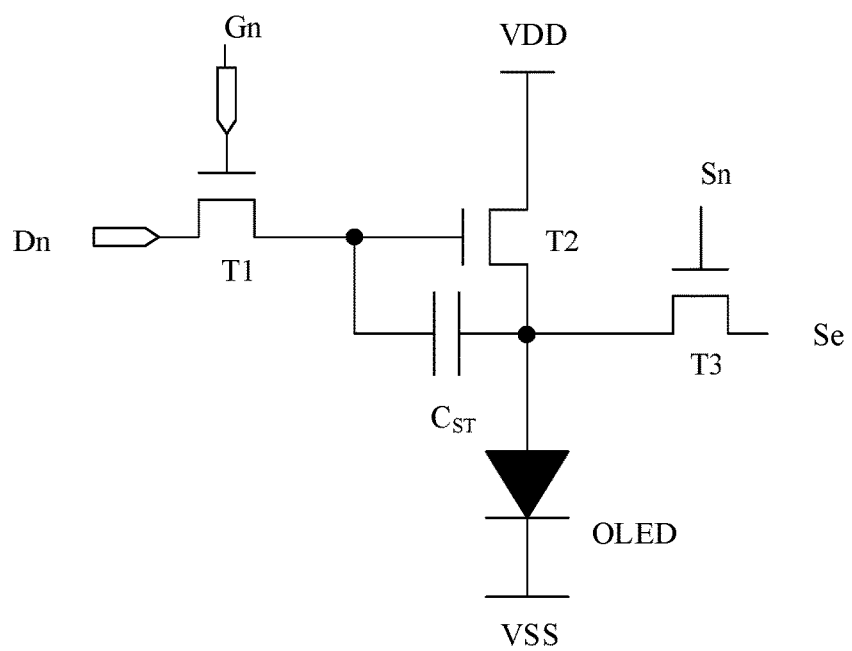
FIG. 4 is a schematic diagram of an equivalent circuit of a pixel driving circuit.

In an exemplary implementation, the pixel driving circuit may have a 3T1C, 4T1C, 5T1C, 5T2C, 6T1C or 7T1C structure. FIG. 4 is a schematic equivalent circuit diagram of a pixel driving circuit. As shown in FIG. 4, the pixel driving circuit has a 3T1C structure, which may include three switching transistors (a first transistor T1, a second transistor T2, and a third transistor T3), one storage capacitor CST, and six signal lines (a data line Dn, a first scanning line Gn, a second scanning line Sn, a compensating line Se, a first power line VDD, and a second power line VSS). In an exemplary implementation, the first transistor T1 is a switching transistor, the second transistor T2 is a driving transistor, and the third transistor T3 is a compensation transistor. A gate electrode of the first transistor T1 is coupled to the first scanning line Gn, a first electrode of the first transistor T1 is coupled to the data line Dn, a second electrode of the first transistor T1 is coupled to a gate electrode of the second transistor T2, and the first transistor T1 is configured to receive a data signal transmitted by the data line Dn under the control of the first scanning line Gn, so that the gate electrode of the second transistor T2 receives the data signal. The gate electrode of the second transistor T2 is coupled to the second electrode of the first transistor T1, a first electrode of the second transistor T2 is coupled to the first power line VDD, a second electrode of the second transistor T2 is coupled to a first electrode of an OLED, and the second transistor T2 is configured to generate a corresponding current at its second electrode under the control of the data signal received by its gate electrode. A gate electrode of the third transistor T3 is coupled to the second scanning line Sn, a first electrode of the third transistor T3 is connected to the compensating line Se, a second electrode of the third transistor T3 is coupled to the second electrode of the second transistor T2, and the third transistor T3 is configured to extract a threshold voltage Vth of the second transistor T2 and a mobility rate in response to compensation timing to compensate the threshold voltage Vth. The first electrode of the OLED is coupled to the second electrode of the second transistor T2, a second electrode of the OLED is coupled to the second power line VSS, and the OLED is configured to emit light of corresponding brightness in response to a current of the second electrode of the second transistor T2. A first electrode of the storage capacitor CST is coupled to the gate electrode of the second transistor T2, a second electrode of the storage capacitor CST is coupled to the second electrode of the second transistor T2, and the storage capacitor CST is configured to store a potential of the gate electrode of the second transistor T2.

In an exemplary implementation, signals of the first power line VDD are high-level signals provided continuously, and signals of the second power line VSS are low-level signals. The first transistor T1 through the third transistor T3 may be P-type transistors or may be N-type transistors. The process flow can be simplified by using the same type of transistors in the pixel driving circuit to reduce the process difficulty of a display panel and improve the product yield rate. In some possible implementations, the first transistor T1 through the third transistor T3 may include P-type transistors and N-type transistors. In an exemplary implementation, the light emitting device may be an organic light emitting Diode (OLED) including a first electrode (anode), an organic light emitting layer, and a second electrode (cathode) which are stacked.

The OLED display substrate may be classified into three types, a bottom emission OLED, a top emission OLED, and a double-sided emission OLED, according to a light emission direction. The bottom emission OLED emits light from a direction of substrate bottom, the top emission OLED emits light from a direction of the substrate top, and the double-sided emission OLED emits light from both the direction of the substrate bottom and the direction of the substrate top. Compared with the bottom emission OLED, the top emission OLED has advantages such as high aperture ratio, high color purity, and easy implementation of high pixels per inch (PPI), and thus receives people's widespread attention.

For the top emission OLED, since the light emission direction is at one side of the cathode, the cathode is required to have excellent light transmittance and conductivity, but meanwhile there is a greater difficulty in satisfying requirements for light transmittance and electric conductivity. For example, in order to satisfy the requirements for the electric conductivity, the thickness of the cathode is required to be relatively large, but the transmittance of the cathode is relatively low at this time, resulting in a problem of a viewing angle color shift. In order to satisfy the requirement for the light transmittance, the thickness of the cathode is required to be relatively small, but the impedance of the cathode is relatively large at this time, resulting in not only problems of voltage rise and increased power consumption, but also a problem of uneven brightness due to uneven voltage distribution throughout the cathode.

In a display substrate of the top emission OLED, in order to reduce a voltage drop across the cathode, an auxiliary electrode is configured to reduce the impedance of the cathode, further reducing the voltage drop across the cathode. In the display substrate, the auxiliary electrode is disposed on a driving circuit layer, the cathode is disposed on a light emitting structure layer, and via holes are formed in the driving circuit layer and the light emitting structure layer by a laser process, so that the cathode is connected to the auxiliary electrode through the via holes. Since a large number of particles are generated in the laser process when the via holes are formed in the organic light emitting layer, such a structure and process seriously affect the product yield rate. Since the tact time is increased using the laser process, the structure and process greatly decrease the production efficiency. Because the via holes formed by the laser process is relatively small and a contact area between the cathode and the auxiliary electrode is relatively small, the structure and process cannot effectively decrease the voltage drop across the cathode, affecting the display effect.

Figure 5:
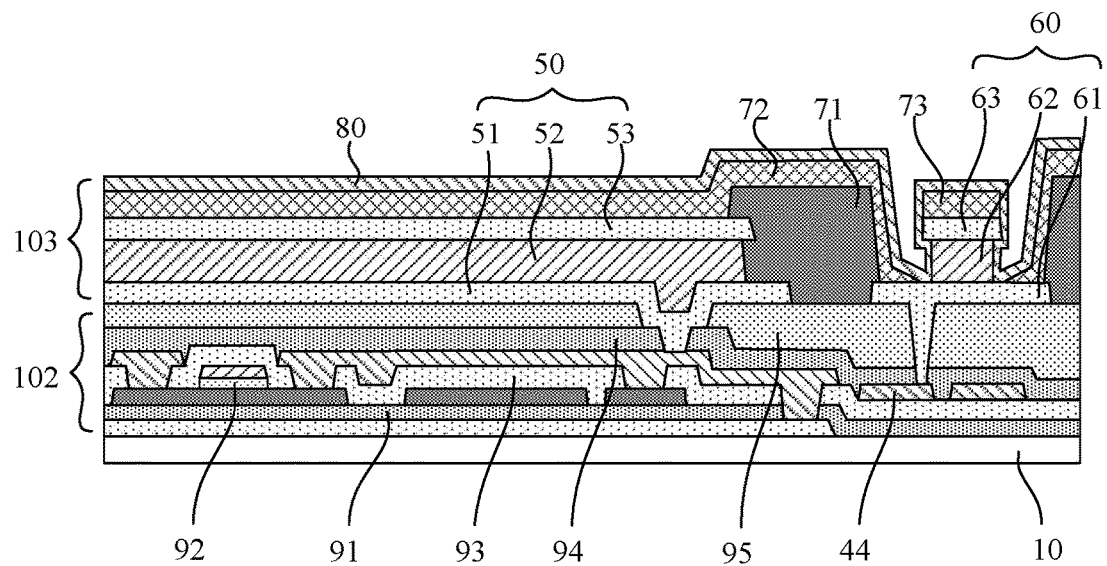
FIG. 5 is a schematic diagram of a structure of a display substrate in accordance with an embodiment of the present disclosure.

FIG. 5 is a schematic structure diagram of a display substrate in accordance with an exemplary embodiment of the present disclosure, which illustrates a sectional structure of one sub-pixel in the display substrate. Referring to FIG. 5, In an exemplary implementation, in a direction perpendicular to the display substrate, the display substrate may include the driving circuit layer 102 disposed on the substrate 10 and the light emitting structure layer 103 disposed at one side of the driving circuit layer 102 away from the substrate 10. The driving circuit layer 102 may include a second power line 44, and transistors and storage capacitors forming the pixel driving circuit. The light emitting structure layer 103 may include an anode 50, an auxiliary electrode 60, a pixel define layer 71, an organic light emitting layer 72 and a cathode 80. The organic light emitting layer 72 is connected to the anode 50 and the cathode 80 respectively, the auxiliary electrode 60 is connected to the second power line 44, and the cathode 80 is connected to the auxiliary electrode 60. The auxiliary electrode 60 includes a bottom surface at one side close to the substrate, a top surface at one side away from the substrate, and a side surface arranged between the bottom surface and the top surface. The cathode 80 is in contact with the side surface of the auxiliary electrode 60.

In an exemplary implementation, in the direction perpendicular to the display substrate, the auxiliary electrode 60 may include a first auxiliary electrode 61, a second auxiliary electrode 62 disposed at one side of the first auxiliary electrode 61 away from the substrate, and a third auxiliary electrode 63 disposed at one side of the second auxiliary electrode 62 away from the substrate. The stacked first auxiliary electrode 61, second auxiliary electrode 62 and third auxiliary electrode 63 form a I-shaped structure, and an orthographic projection of the second auxiliary electrode 62 on the substrate is within both an orthographic projection of the first auxiliary electrode 61 on the substrate and an orthographic projection of the third auxiliary electrode 63 on the substrate.

In an exemplary implementation, the light emitting structure layer 102 may include an organic light emitting block 73. The organic light emitting block 73 and the organic light emitting layer 72 are arranged on the same layer, are made of the same materials, and are formed simultaneously through the same running of an evaporation process. In an exemplary implementation, the organic light emitting block 73 is arranged at one side of the auxiliary electrode 60 away from the substrate, and the organic light emitting block 73 is arranged to be isolated from the organic light emitting layer 72.

In an exemplary implementation, the organic light emitting block 73 is disposed at one side of the third auxiliary electrode 63 away from the substrate, and an orthographic projection of the organic light emitting block 73 on the substrate is within the orthographic projection of the third auxiliary electrode 63 on the substrate.

In an exemplary implementation, in the direction perpendicular to the display substrate, the anode 50 may include a first anode 51, a second anode 52 arranged at one side of the first anode 51 away from the substrate, and a third anode 53 arranged at one side of the second anode 52 away from the substrate. The stacked first anode 51, second anode 52, and third anode 53 form an I-shaped structure, and an orthographic projection of the second anode 52 on the substrate is within both an orthographic projection of the first anode 51 on the substrate and an orthographic projection of the third anode 53 on the substrate.

In an exemplary implementation, the first auxiliary electrode 61 and the first anode 51 are arranged on the same layer, are made of the same materials, and are formed simultaneously through the same running of patterning processes.

In an exemplary implementation, the second auxiliary electrode 62 and the second anode 52 are arranged on the same layer, are made of the same materials, and are formed simultaneously through the same running of the patterning processes.

In an exemplary implementation, the third auxiliary electrode 63 and the third anode 53 are arranged on the same layer, are made of the same materials, and are formed simultaneously through the same running of the patterning processes.

In an exemplary implementation, the driving circuit layer 102 may include a first conducting layer disposed on the substrate 10, a first insulating layer 91 overlying the first conducting layer, a semiconductor layer disposed on the first insulating layer 91, a second insulating layer 92 disposed on the semiconductor layer, a second conducting layer disposed on the second insulating layer 92, a third insulating layer 93 overlying the second conducting layer, a third conducting layer disposed on the third insulating layer 93, a fourth insulating layer 94 overlying the third conducting layer, and a planarization layer 95 overlying the fourth insulating layer 94. The first conducting layer at least includes a shielding layer, the semiconductor layer at least includes a first capacitor polar plate and active layers of a plurality of transistors, the second conducting layer at least includes gate electrodes of the plurality of transistors, and the third conducting layer at least includes a second power line, a second capacitor polar plate and first electrodes and second electrodes of the plurality of transistors. The second capacitor polar plate is connected to the shielding layer through via holes, the second capacitor polar plate and the first capacitor polar plate form a first storage capacitor, and the shielding layer and the first capacitor polar plate form a second storage capacitor. Anode via holes and electrode via holes are provided in the fourth insulating layer 94 and the planarization layer 95, the anode is connected to the second capacitor polar plate through the anode via holes, and the auxiliary electrode is connected to the second power line through the electrode via holes.

In an exemplary implementation, a first pixel opening and a second pixel opening are provided in the pixel define layer 71 in the light emitting structure layer 103, the first pixel opening exposes part of a surface of the third anode 53, and the second pixel opening exposes the second auxiliary electrode 62 and the third auxiliary electrode 63.

In an exemplary implementation, the cathode 80 in the light emitting structure layer 103 implements a large-area contact connection with the auxiliary electrode 60 by wrapping the organic light emitting block 73 and the auxiliary electrode 60.

In an exemplary implementation, for the first auxiliary electrode 61, the second auxiliary electrode 62, the third auxiliary electrode 63 and the organic light emitting block 73 which are stacked in a direction away from the substrate, the exposed surfaces of the organic light emitting block 73 include: an upper surface at one side away from the substrate and a side surface located at the side; the exposed surfaces of the third auxiliary electrode 63 include: a third side surface located at the side and a third lower surface protruding from the second auxiliary electrode and at one side close to the substrate, and the exposed surface of the second auxiliary electrode 62 includes: a second side surface located at the side. In an exemplary implementation, the side surfaces refer to a plurality of circumferential surfaces, normal directions of which are parallel or nearly parallel to a plane of the substrate. The cathode 80 wrapping the organic light emitting block 73 and the auxiliary electrode 60 means that the cathode 80 overlies or partially overlies the upper surface and all the side surfaces of the organic light emitting block 73, the cathode 80 overlies or partially overlies all the third side surfaces and the third lower surface of the third auxiliary electrode 63, or the cathode 80 overlies or partially overlies all the second side surfaces of the second auxiliary electrode 62.

In an exemplary implementation, in the direction parallel to the display substrate, the shape of the auxiliary electrode 60 may be any one or more of: a triangle, a rectangle, a trapezoid, a polygon, a circle and an ellipse.

In an exemplary implementation, in the direction parallel to the display substrate, the display substrate includes a plurality of pixel units, and the auxiliary electrode may be arranged between anodes of adjacent pixel units.

A process of manufacturing the display substrate will be described exemplarily below. "Patterning processes" mentioned in the present disclosure include photoresist coating, mask exposure, development, etching, photoresist stripping, etc., for metal materials, inorganic materials or transparent conducting materials, and includes organic material coating, mask exposure, development, etc., for organic materials. Deposition may be any one or more of sputtering, evaporation and chemical vapor deposition, coating may be any one or more of spray coating, spin coating and inkjet printing, and etching may be any one or more of dry etching and wet etching, which are not limited in the present disclosure. "Film" refers to a layer of film formed by a certain material on a substrate using deposition, coating or other processes. If the "film" does not need the patterning processes in the entire manufacturing process, the "film" may also be called a "layer". If the "film" needs the patterning processes in the entire manufacturing process, the "film" is called a "film" before the patterning processes and is called a "layer" after the patterning processes. The "layer" processed by the patterning processes includes at least one "pattern". "A and B are disposed on the same layer" in the present disclosure means that A and B are formed simultaneously through the same running of the patterning processes, and the "thickness" of the film layer is the size of the film layer in a direction perpendicular to the display substrate. In an exemplary embodiment of the present disclosure, "an orthographic projection of B is within an orthographic projection of A" means that the boundary of the orthographic projection of B falls within the boundary of the orthographic projection of A, or the boundary of the orthographic projection of A is overlapped with the boundary of the orthographic projection of B.

In an exemplary implementation, taking two pixel units (6 sub-pixels) of the display substrate as an example, the process of manufacturing the display substrate may include the following operations.

(1) A substrate is provided. In an exemplary implementation, the substrate may be a flexible substrate or may be a rigid substrate. In an exemplary implementation, the flexible substrate may include a first flexible material layer, a first inorganic material layer, a semiconductor layer, a second flexible material layer and a second inorganic material layer which are stacked. Materials of the first and second flexible material layers may be polyimide (PI), polyethylene terephthalate (PET) or surface treated polymer soft films; materials of the first and second inorganic material layers may be silicon nitride (SiNx) or silicon oxide (SiOx) for improving the water and oxygen resistance of the substrate, and the first and second inorganic material layers may also be called barrier layers; and a material of the semiconductor layer may be amorphous silicon (a-si). In an exemplary implementation, taking a stacked structure as an example, its manufacturing process may include: firstly coating a layer of polyimide on a glass carrier board, and curing it into a film to form a first flexible (PI1) layer; then depositing a layer of barrier film on the first flexible layer to form a first barrier (Barrier1) layer overlying the first flexible layer; then depositing a layer of amorphous silicon film on the first barrier layer to form an amorphous silicon (a-si) layer overlying the first barrier layer; then coating a layer of polyimide on the amorphous silicon layer, and curing it into a film to form a second flexible (PI2) layer; and then depositing a barrier film on the second flexible layer to form a second barrier (Barrier2) layer overlying the second flexible layer, to complete the manufacturing of the substrate 101.

Figure 6A:
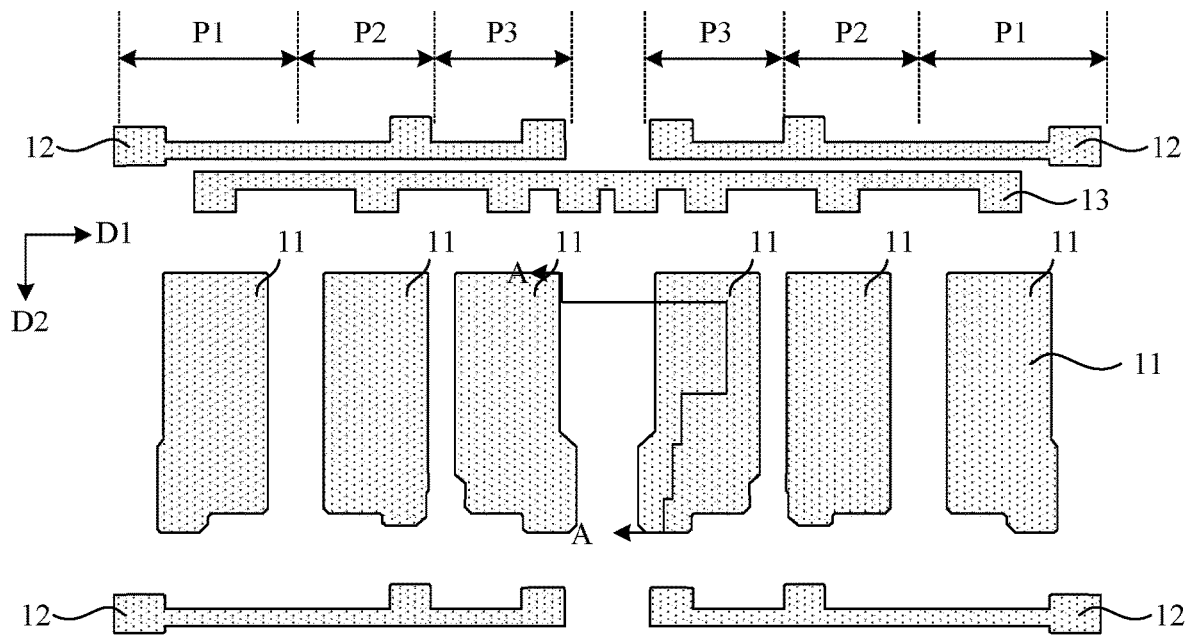
FIG. 6A is a schematic diagram that a pattern of a first conducting layer is formed in accordance with an embodiment of the present disclosure.
Figure 6B:
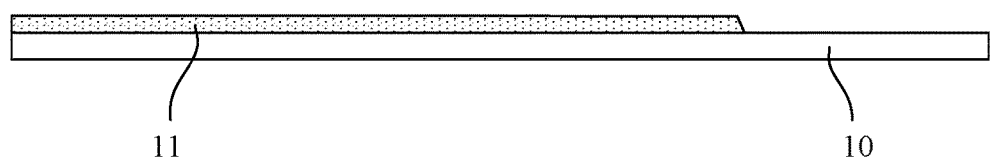
FIG. 6B is a sectional view taken along the direction A-A in FIG. 6A.

(2) A pattern of a first conducting layer is formed. In an exemplary embodiment, forming the pattern of the first conducting layer may include: depositing a first metal film on the substrate, and patterning the first metal film through the patterning processes to form the pattern of the first conducting layer on the substrate. The pattern of the first conducting layer at least include a shielding layer 11, a power connecting line 12, and a compensation connecting line 13, as shown in FIGS. 6A and 6B. FIG. 6B is a sectional view taken along the direction A-A in FIG. 6A.

In an exemplary embodiment, the shielding layer 11 is provided in each sub-pixel, and may be configured in a rectangular shape with a protrusion or groove. The power connecting line 12 is arranged in one pixel unit and extends to a first sub-pixel P1, a second sub-pixel P2 and a third sub-pixel P3 along a first direction D1 or a direction opposite to the first direction D1. The power connecting lines 12 between the adjacent pixel units are arranged at intervals. The power connecting line 12 is configured to connect a first power line formed subsequently and provide power signals for a pixel driving circuit of each sub-pixel in the pixel unit in which the power connecting line 12 is located. The compensation connecting line 13 is arranged in one pixel unit and extends to the first sub-pixel P1, the second sub-pixel P2 and the third sub-pixel P3 along the first direction D1 or the direction opposite to the first direction D1. The compensation connecting lines 13 of two adjacent pixel units are connected to each other to form an integrated structure. The compensation connecting line 13 is configured to connect a compensating line formed subsequently and provide compensation signals for the pixel driving circuit of each sub-pixel in the pixel unit in which the compensation connecting line 13 is located.

As shown in FIG. 6B, after this running of the processes, the display substrate includes the first conducting layer disposed on the substrate 10, and the first conducting layer at least includes the shielding layer 11.

Figure 7A:
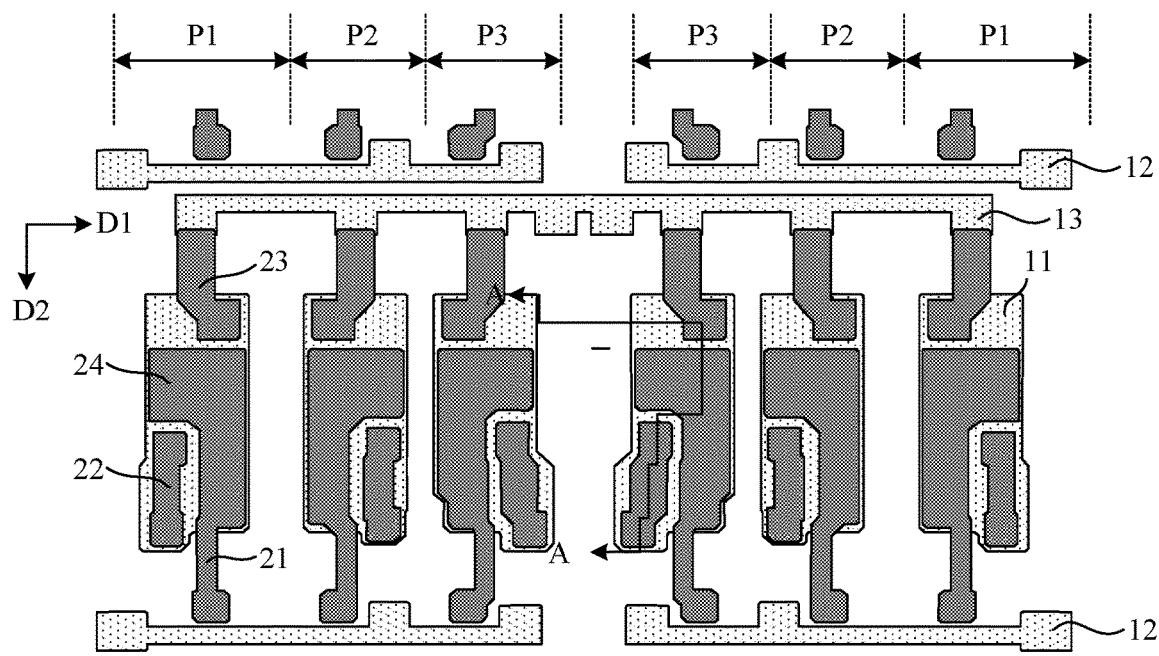
FIG. 7A is a schematic diagram that a pattern of a semiconductor layer is formed in accordance with an embodiment of the present disclosure.
Figure 7B:
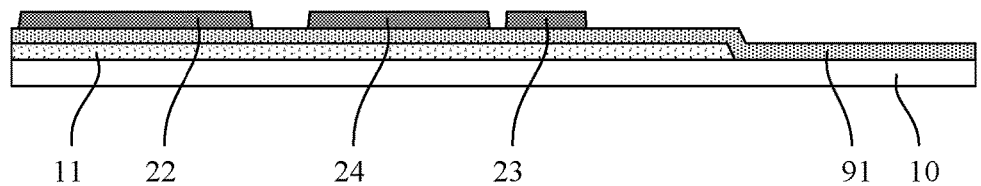
FIG. 7B is a sectional view taken along the direction A-A in FIG. 7A.

(3) A pattern of a semiconductor layer is formed. In an exemplary embodiment, forming the pattern of the semiconductor layer may include: depositing a first insulating film and a semiconductor film sequentially on the substrate, on which the aforementioned patterns are formed, and patterning the semiconductor film through the patterning processes to form a first insulating layer overlying the pattern of the first metal layer and form the pattern of the semiconductor layer disposed on the first insulating layer. The pattern of the semiconductor layer of each sub-pixel may include a first active layer 21 of a first transistor T1, a second active layer 22 of a second transistor T2, a third active layer 23 of a third transistor T3 and a first capacitor polar plate 24, as shown in FIGS. 7A and 7B. FIG. 7B is a sectional view taken along the direction A-A in FIG. 7A.

In an exemplary embodiment, the first active layer 21, the second active layer 22 and the third active layer 23 in each sub-pixel may all have a strip shape extending along a second direction D2 and are arranged at intervals. The first capacitor polar plate 24 may have a rectangular shape with a protrusion or groove. The first active layer 21 and the first capacitor polar plate 24 are connected to each other to form an integrated structure. An orthographic projection of the second active layer 22 on the substrate is within an orthographic projection of the shielding layer 11 on the substrate, and an orthographic projection of the first capacitor polar plate 24 on the substrate is within the orthographic projection of the shielding layer 11 on the substrate.

As shown in FIG. 7B, after this running of the processes, the display substrate includes the first conducting layer disposed on the substrate 10, the first insulating layer 91 overlying the first conducting layer, and the semiconductor layer disposed on the first insulating layer 91. The first conducting layer at least includes the shielding layer 11, and the semiconductor layer at least includes the second active layer 22, the third active layer 23 and the first capacitor polar plate 24.

Figure 8A:
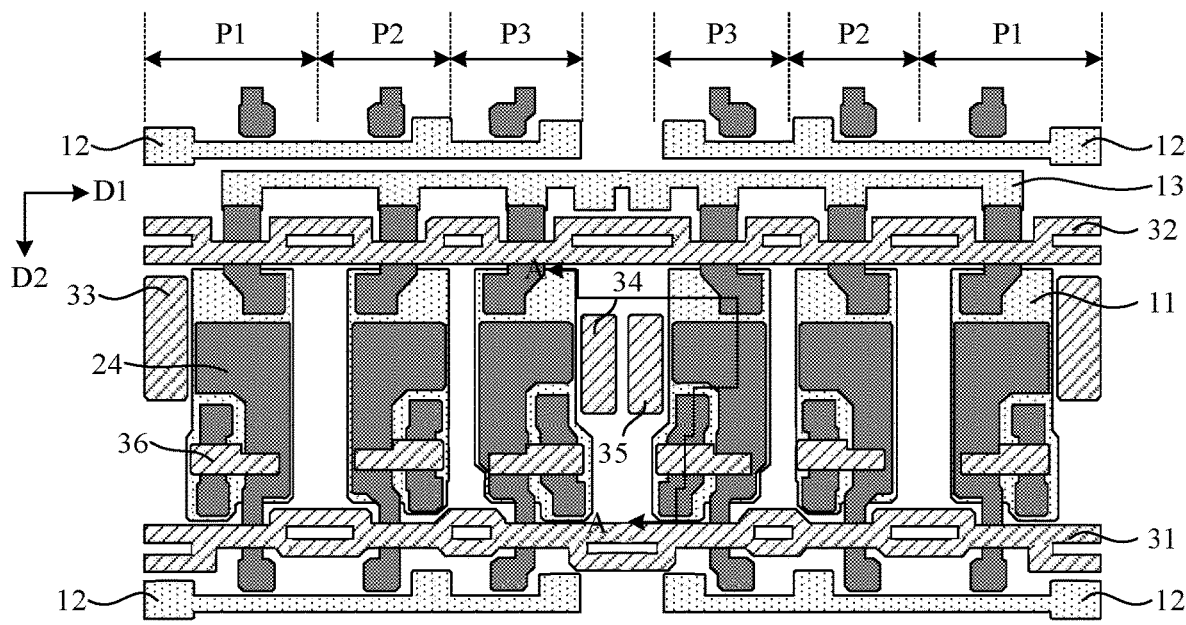
FIG. 8A is a schematic diagram that a pattern of a second conducting layer after isformed in accordance with an embodiment of the present disclosure.
Figure 8B:
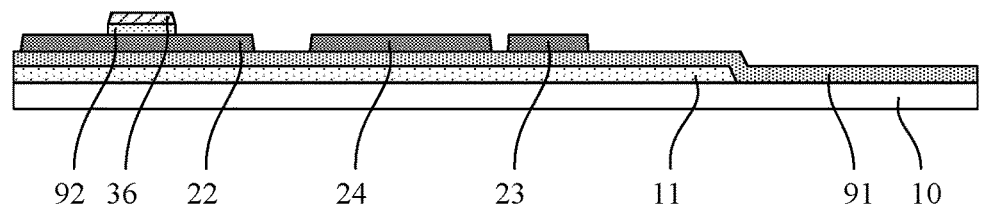
FIG. 8B is a sectional view taken along the direction A-A in FIG. 8A.

(4) Pattern of a second conducting layer is formed. In an exemplary embodiment, forming the pattern of the second conducting layer may include: depositing a second insulating film and a second metal film sequentially on the substrate, on which the aforementioned patterns are formed, and patterning the second metal film and the second insulating film through the patterning processes to form a second insulating layer and form the pattern of the second conducting layer disposed on the second insulating layer. The pattern of the second conducting layer at least include a first scanning line 31, a second scanning line 32, a first protective electrode 33, a second protective electrode 34, a third protective electrode 35 and a second gate electrode 36, as shown in FIGS. 8A and 8B. FIG. 8B is a sectional view taken along the direction A-A in FIG. 8A. In an exemplary embodiment, the second conducting layer is referred to as a gate metal (GATE) layer.

In an exemplary embodiment, the first scanning line 31 and the second scanning line 32 extend along the first direction D1. An overlapping area between the first scanning line 31 and the first active layer 21 in each sub-pixel serves as a gate electrode of the first transistor T1 in the sub-pixel where the first scanning line 31 is located, and an overlapping area between the second scanning line 32 and the third active layer 23 in each sub-pixel serves as a gate electrode of the third transistor T3 in the sub-pixel in which the second scanning line 32 is located. In an exemplary embodiment, areas except the areas in the first scanning line 31 and the second scanning line 32 which serve as the gate electrodes may be configured to form a double-wire structure to improve the reliability of signal transmission.

In an exemplary embodiment, the first protective electrode 33, the second protective electrode 34, and the third protective electrode 35 all have a strip shape extending along the second direction D2. The first protective electrode 33 may be arranged in each pixel unit and located at one side of the first sub-pixel P1 away from the second sub-pixel P2, and the first protective electrode 33 is configured to be connected to a first power line formed subsequently. The second protective electrode 34 and the third protective electrode 35 may be arranged between the third sub-pixels P3 of two adjacent pixel units, and the second protective electrode 34 and the third protective electrode 35 are arranged along the first direction D1 sequentially. The second protective electrode 34 is configured to be connected to a compensating line formed subsequently, and the third protective electrode 35 is configured to be connected to a second power line formed subsequently.

In an exemplary embodiment, the second gate electrode 36 have a strip shape extending along the first direction D1, and can be arranged in each sub-pixel. An orthographic projection of the second gate electrode 36 on the substrate is overlapped with both the orthographic projection of the second active layer 22 on the substrate and the orthographic projection of the first capacitor polar plate 24 on the substrate.

In an exemplary embodiment, after the pattern of the second conducting layer is formed, the semiconductor layer may be metalized by using the second conducting layer as a shield. Areas of the semiconductor layer which are shielded by the second conducting layer form channel regions of the first transistor T1, the second transistor T2 and the third transistor T3, and areas of the semiconductor layer which are not shielded by the second conducting layer are metalized, that is, both first regions and second regions of the first capacitor polar plate 24 and the three active layers are metalized.

As shown in FIG. 8B, after this running of the processes, the display substrate includes the first conducting layer disposed on the substrate 10, the first insulating layer 91 overlying the first conducting layer, the semiconductor layer disposed on the first insulating layer 91, the second insulating layer 92 and the second conducting layer disposed on the second insulating layer 92. The first conducting layer at least includes the shielding layer 11, the semiconductor layer at least includes the second active layer 22, the third active layer 23 and the first capacitor polar plate 24, and the second conducting layer at least includes the second gate electrode 36. In an exemplary embodiment, the pattern of the second insulating layer may be substantially the same as the pattern of the second conducting layer, and an orthographic projection of the second conducting layer on the substrate is within an orthographic projection of the second insulating layer on the substrate.

Figure 9A:
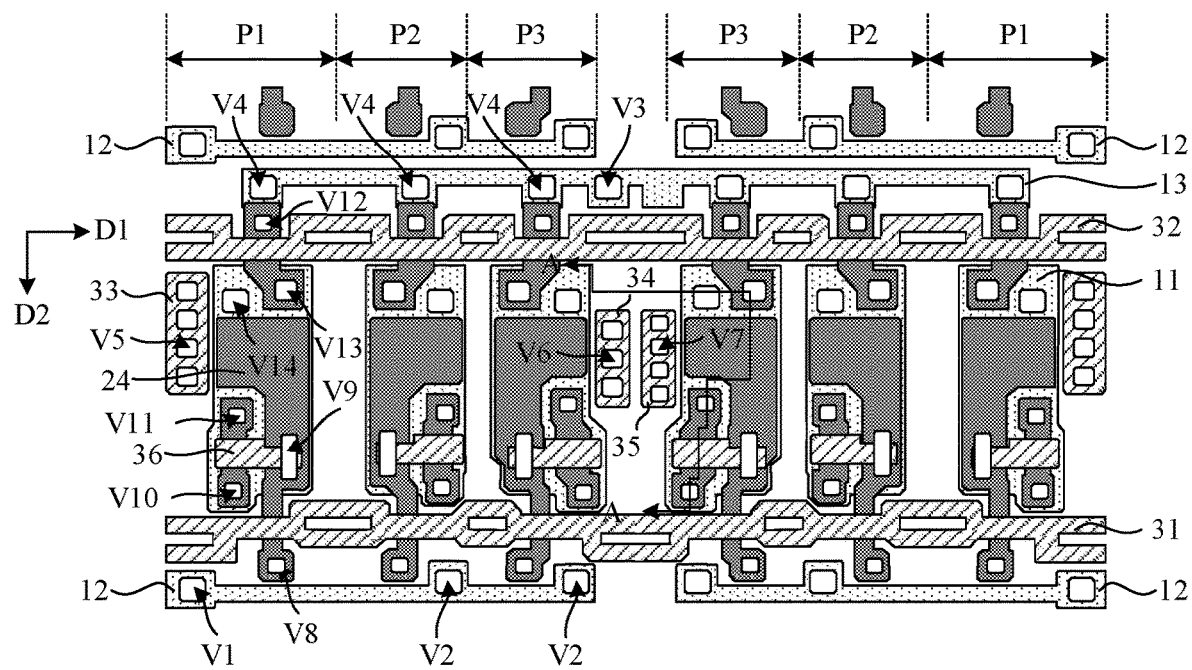
FIG. 9A is a schematic diagram that a pattern of a third insulating layer is formed in accordance with an embodiment of the present disclosure.
Figure 9B:
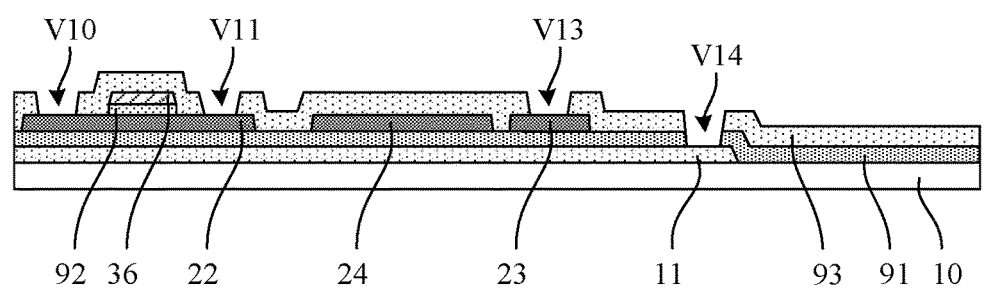
FIG. 9B is a sectional view taken along the direction A-A in FIG. 9A.

(5) A pattern of a third insulating layer is formed. In an exemplary embodiment, forming the pattern of the third insulating layer may include: depositing a third insulating film on the substrate, on which the aforementioned patterns are formed, and patterning the third insulating film through the patterning processes to form the third insulating layer overlying the first conducting layer. A plurality of via holes, which at least includes a first via hole V1 to a fourteenth via hole V14, is provided in the third insulating layer, as shown in FIGS. 9A and 9B. FIG. 9B is a sectional view taken along the direction A-A in FIG. 9A.

As shown in FIG. 9A, in an exemplary embodiment, the first via hole V1 is arranged on the power connecting line 12 of the first sub-pixel P1, and the second via hole V2 is arranged on the power connecting lines 12 of the second sub-pixel P2 and the third sub-pixel P3 respectively. The third insulating layer and the first insulating layer in the first via hole V1 and the second via hole V2 are etched away to expose surfaces of the power connecting lines 12. The first via hole V1 is configured to allow the subsequently formed first power line to be connected with the power connecting line 12 through the via hole V1, and the second via hole V2 is configured to allow the subsequently formed first electrode of the second transistor T2 to be connected with the power connecting lines 12 through the via hole V2.

In an exemplary embodiment, the third via hole V3 is arranged on the compensation connecting lines 13 between the adjacent third sub-pixels P3, and the fourth via hole V4 is arranged on the compensation connecting line 13 of each sub-pixel. The third insulating layer and the first insulating layer in the third via hole V3 and the fourth via hole V4 are etched away to expose surfaces of the compensation connecting lines 13. The third via hole V3 is configured to allow the subsequently formed compensating line to be connected with the compensation connecting line 13 through the third via hole V3, and the fourth via hole V4 is configured to allow the subsequently formed first electrode of the third transistor T3 to be connected with the compensation connecting lines 13 through the fourth via hole V4.

In an exemplary embodiment, a plurality of fifth via holes V5 are provided in an area where the first protective electrode 33 is located, and the third insulating layer in the fifth via holes V5 is etched away to expose a surface of the first protective electrode 33. The fifth via holes V5 are configured to allow the subsequently formed first power line to be connected with the first protective electrode 33 through the via holes V5. Providing the plurality of fifth via holes V5 can improve the connection reliability.

In an exemplary embodiment, a plurality of sixth via holes V6 are provided in an area where the second protective electrode 34 is located, and the third insulating layer in the sixth via holes V6 is etched away to expose a surface of the second protective electrode 34. The sixth via holes V6 are configured to allow the subsequently formed compensating line to be connected with the second protective electrode 34 through the via holes V6. Providing the plurality of sixth via holes V6 can improve the connection reliability.

In an exemplary embodiment, a plurality of seventh via holes V7 are provided in an area where the third protective electrode 35 is located, and the third insulating layer in the seventh via holes V7 is etched away to expose a surface of the third protective electrode 35. The seventh via holes V7 are configured to allow the subsequently formed second power line to be connected with the third protective electrode 35 through the via holes V7. Providing the plurality of seventh via holes V7 can improve the connection reliability.

In an exemplary embodiment, the eighth via hole V8 is provided in an area where a first region of the first active layer of each sub-pixel is located, and the third insulating layer in the eighth via hole V8 is etched away to expose a surface of the first region of the first active layer. The eighth via hole V8 is configured to allow the subsequently formed data line to be connected with the first region of the first active layer through the via hole V8.

In an exemplary embodiment, the ninth via hole V9 is provided in an area where the first capacitor polar plate 24 and the second gate electrode 36 of each sub-pixel are located, and the third insulating layer in the ninth via hole V9 is etched away to expose both a surface of the first capacitor polar plate 24 and a surface of the second gate electrode 36. The ninth via hole V9 is configured to allow the subsequently formed second electrode of the first transistor T1 (a gate electrode of the second transistor T2) to be connected with both the first capacitor polar plate 24 and the second gate electrode 36 through the via hole V9.

In an exemplary embodiment, the tenth via hole V10 is provided in an area where a first region of the second active layer of each sub-pixel is located, and the third insulating layer in the tenth via hole V8 is etched away to expose a surface of the first region of the second active layer. The tenth via hole V10 of the first sub-pixel P1 is configured to allow the subsequently formed first power line to be connected with the first region of the second active layer through the via hole V10, and the tenth via holes V10 of the second sub-pixel P2 and the third sub-pixel P3 are configured to allow the subsequently formed first electrode of the second transistor T2 to be connected with the first region of the second active layer through the via holes V10.

In an exemplary embodiment, the eleventh via hole V11 is provided in an area where a second region of the second active layer of each sub-pixel is located, and the third insulating layer in the eleventh via hole V11 is etched away to expose a surface of the second region of the second active layer. The eleventh via hole V11 is configured to allow the subsequently formed second capacitor polar plate (a second electrode of the second transistor T2 and a second electrode of the third transistor T3) to be connected with the second region of the second active layer through the via hole V11.

In an exemplary embodiment, the twelfth via hole V12 is provided in an area where a first region of the third active layer of each sub-pixel is located, and the third insulating layer in the twelfth via hole V12 is etched away to expose a surface of the first region of the third active layer. The twelfth via hole V12 is configured to allow the subsequently formed first electrode of the third transistor T3 to be connected with the first region of the third active layer through the via hole V12.

In an exemplary embodiment, the thirteenth via hole V13 is provided in an area where a second region of the third active layer of each sub-pixel is located, and the third insulating layer in the thirteenth via hole V13 is etched away to expose a surface of the second region of the third active layer. The thirteenth via hole V13 is configured to allow the subsequently formed second capacitor polar plate (the second electrode of the second transistor T2 and the second electrode of the third transistor T3) to be connected with the second region of the third active layer through the via hole V13.

In an exemplary embodiment, the fourteenth via hole V14 is provided in the area where the shielding layer 11 of each sub-pixel is located, and the third insulating layer and the first insulating layer in the fourteenth via hole V14 are etched away to expose a surface of the shielding layer 11. The fourteenth via hole V14 is configured to allow the subsequently formed second capacitor polar plate (the second electrode of the second transistor T2 and the second electrode of the third transistor T3) to be connected with the shielding layer 11 through the via hole V14.

As shown in FIG. 9B, after this running of the processes, the display substrate includes the first conducting layer disposed on the substrate 10, the first insulating layer 91 overlying the first conducting layer, the semiconductor layer disposed on the first insulating layer 91, the second insulating layer 92, the second conducting layer disposed on the second insulating layer 92, and the third insulating layer 93 overlying the second conducting layer. The first conducting layer at least includes the shielding layer 11, the semiconductor layer at least includes the second active layer 22, the third active layer 23 and the first capacitor polar plate 24, and the second conducting layer at least includes the second gate electrode 36. A plurality of via holes, which at least includes the tenth via hole V10, the eleventh via hole V11, the thirteenth via hole V13 and the fourteenth via hole V14, is provided in the third insulating layer 93.

Figure 10A:
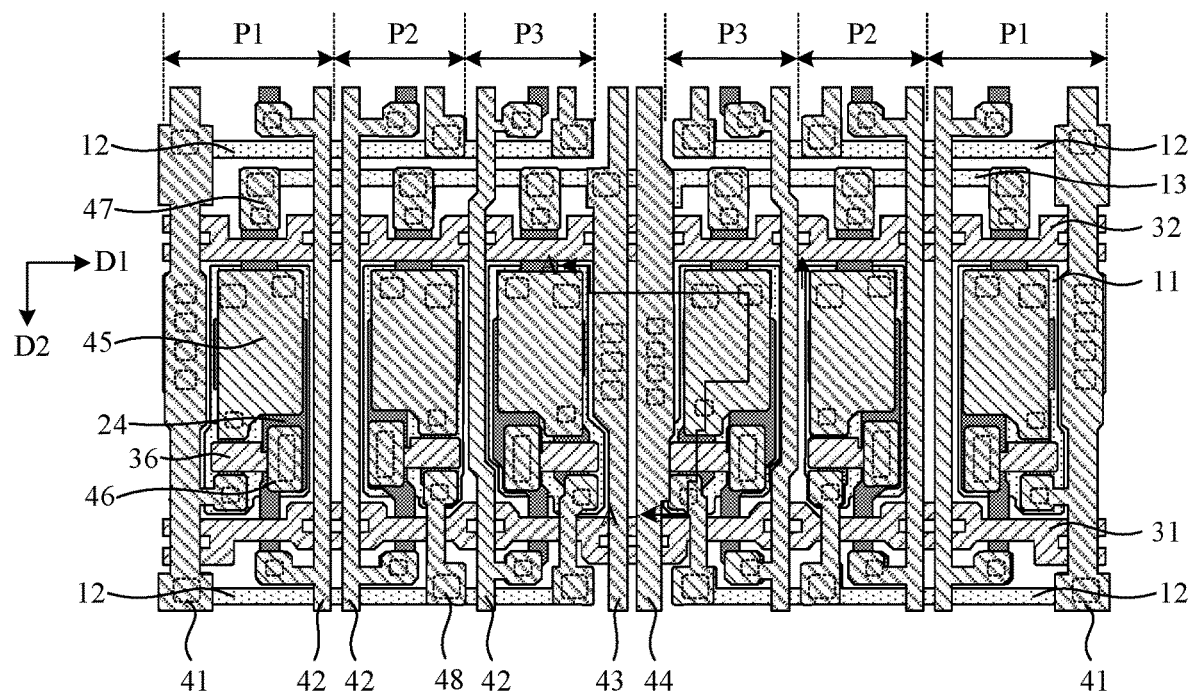
FIG. 10A is a schematic diagram that a pattern of a third conducting layer is formed in accordance with an embodiment of the present disclosure.
Figure 10B:
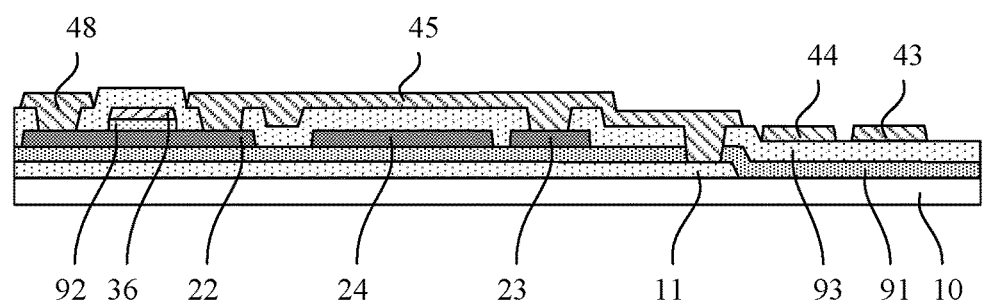
FIG. 10B is a sectional view taken along the direction A-A in FIG. 10A.

(6) A pattern of a third conducting layer is formed. In an exemplary embodiment, forming the pattern of the third conducting layer may include: depositing a third metal film on the substrate, on which the aforementioned patterns are formed, and patterning the third metal film through the patterning processes to form the third conducting layer disposed on the third insulating layer. The third conducting layer at least includes a first power line 41, a data line 42, a compensating line 43, a second power line 44, a second capacitor polar plate 45, a first connecting electrode 46, a second connecting electrode 47 and a third connecting electrode 48, as shown in FIGS. 10A and 10B. FIG. 10B is a sectional view taken along the direction A-A in FIG. 10A. In an exemplary embodiment, the third conducting layer may be referred to as a source-drain (SD) metal layer.

As shown in FIG. 10A, in an exemplary embodiment, the first power line 41 is arranged in each pixel unit and located at one side of the first sub-pixel P1 away from the second sub-pixel P2. The first power line 41 extends along the second direction D2. On one hand, the first power line 41 is connected to the power connecting line 12 through the first via holes V1; on the other hand, the first power line 41 is connected to the first protective electrode 33 through the plurality of fifth via holes V5, and connected to the first region of the second active layer of the first sub-pixel P1 through the tenth via hole V10 on the other hand, such that high-level signals transmitted by the first power line 41 are written to the first electrode of the second transistor T2.

In an exemplary embodiment, the data line 42 is arranged in each sub-pixel. The data line 42 extends along the second direction D2 and is connected to the first region of the first active layer through the eighth via hole V8, such that data signals transmitted by the data line 42 are written to the first transistor T1 of each sub-pixel. In an exemplary embodiment, the data line 42 in the second sub-pixel P2 is arranged close to the data line 42 in the third sub-pixel P3.

In an exemplary embodiment, the compensating line 43 is arranged between the third sub-pixels P3 of two adjacent pixel units. The compensating line 43 extends along the second direction D2. On one hand, the compensating line 43 is connected to the second protective electrode 34 through the plurality of sixth via holes V6; on the other hand, the compensating line 43 is connected to the compensation connecting line 13 through the third via hole V3, such that compensation signals transmitted by the compensating line 43 are written to the third transistor T3 of each sub-pixel through the compensation connecting line 13.

In an exemplary embodiment, the second power line 44 is arranged between the third sub-pixels P3 of two adjacent pixel units, and the second power line 44 extends along the second direction D2, and is connected to the third protective electrode 35 through the plurality of seventh via holes V7.

In an exemplary embodiment, the second capacitor polar plate 45 is arranged in each sub-pixel. On one hand, the second capacitor polar plate 45 is connected to the second region of the second active layer through the eleventh via hole V11; on the other hand, the second capacitor polar plate 45 is connected to the second region of the third active layer through the thirteenth via hole V13, and connected to the shielding layer 11 through the fourteenth via hole V14 on the other hand. In an exemplary embodiment, an orthographic projection of the second capacitor polar plate 45 on the substrate 10 is overlapped with the orthographic projection of the first capacitor polar plate 24 on the substrate, and the second capacitor polar plate 45 and the first capacitor polar plate 24 form a first storage capacitor. Because the second capacitor polar plate 45 is connected to the shielding layer 11, the second capacitor polar plate 45 and the shielding layer 11 have the same potential, such that the shielding layer 11 and the first capacitor polar plate 24 form a second storage capacitor, and the first storage capacitor and second storage capacitor connected in parallel are formed in each sub-pixel, thereby increasing capacities of the storage capacitors of each sub-pixel effectively. In an exemplary embodiment, the second capacitor polar plate 45 may serve as both the second electrode of the second transistor T2 and the second electrode of the third transistor T3, so that the second capacitor polar plate 45, the second electrode of the second transistor T2 and the second electrode of the third transistor T3 have the same potential.

In an exemplary embodiment, the first connecting electrode 46 is arranged in each sub-pixel, and the first connecting electrode 46 is connected to both the first capacitor polar plate 24 and the second gate electrode 36 through the ninth via hole V9. In an exemplary embodiment, the first connecting electrode 46 can serve as the second electrode of the first transistor T1, so that the gate electrode of the second transistor T2, the second electrode of the first transistor T1 and the first capacitor polar plate 24 have the same potential.

In an exemplary embodiment, the second connecting electrode 47 is arranged in each sub-pixel. On one hand, the second connecting electrode 47 is connected to the compensation connecting line 13 through the fourth via hole V4; on the other hand, the second connecting electrode 47 is connected to the first region of the third active layer through the twelfth via hole V12. In an exemplary embodiment, the second connecting electrode 47 can serve as the first electrode of the third transistor T3, so that the compensation signals transmitted by the compensating line 43 are written to the third transistor T3 of each sub-pixel through the compensation connecting line 13.

In an exemplary embodiment, the third connecting electrode 48 is arranged in the second sub-pixel P2 and the third sub-pixel P3 of each pixel unit. On one hand, the third connecting electrode 48 is connected to the power connecting line 12 through the second via hole V2; on the other hand, the third connecting electrode 48 is connected to the first region of the second active layer through the tenth via hole V10. In an exemplary embodiment, the third connecting electrode 48 can serve as the first electrode of the second transistor T2, so that the high-level signals transmitted by the first power line 41 are written to the first electrode of the second transistor T2 through the power connecting line 12.

As shown in FIG. 10B, after this running of the processes, the display substrate includes the first conducting layer disposed on the substrate 10, the first insulating layer 91 overlying the first conducting layer, the semiconductor layer disposed on the first insulating layer 91, the second insulating layer 92, the second conducting layer disposed on the second insulating layer 92, the third insulating layer 93 overlying the second conducting layer and the third conducting layer disposed on the third insulating layer 93. The first conducting layer at least includes the shielding layer 11, the semiconductor layer at least includes the second active layer 22, the third active layer 23 and the first capacitor polar plate 24, and the second conducting layer at least includes the second gate electrode 36. A plurality of via holes, which at least includes the tenth via hole V10, the eleventh via hole V11, the thirteenth via hole V13 and the fourteenth via hole V14, are provided in the third insulating layer 93. The third conducting layer at least includes the compensating line 43, the second power line 44, the second capacitor polar plate 45 and the third connecting electrode 48. The third connecting electrode 48 is connected to the second active layer 22 through the tenth via hole V10, and the second capacitor polar plate 45 is connected to the second active layer 22, the third active layer 23 and the shielding layer 11 through the eleventh via hole V11, the thirteenth via hole V13 and the fourteenth via hole V14, respectively.

Figure 11A:
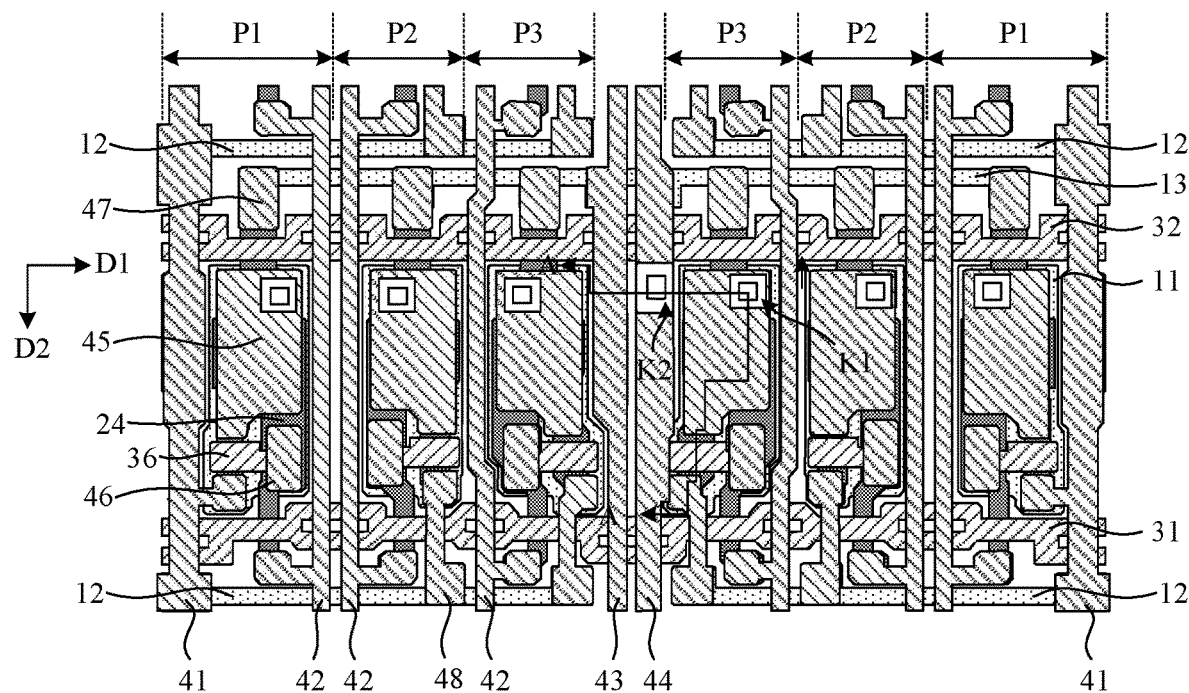
FIG. 11A is a schematic diagram that a pattern of a first planarization layer is formed in accordance with an embodiment of the present disclosure.
Figure 11B:
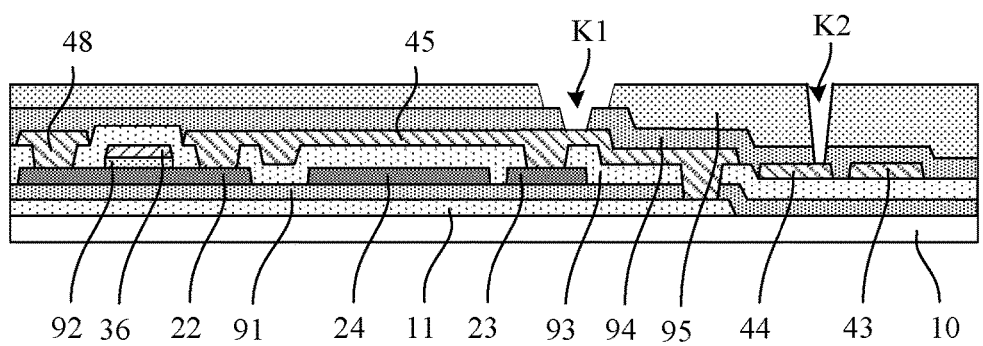
FIG. 11B is a sectional view taken along the direction A-A in FIG. 11A.

(6) A pattern of a fourth insulating layer and a first planarization layer is formed. In an exemplary embodiment, forming the patterns of the fourth insulating layer and the first planarization layer may include: first depositing a fourth insulating film on the substrate, on which aforementioned patterns are formed, then coating a planarization film, and patterning the planarization film and the fourth insulating film through the patterning processes to form the fourth insulating layer overlying the third conducting layer and form the planarization layer disposed on the fourth insulating layer. Patterns of anode via holes K1 and electrode via holes K2 are provided in the fourth insulating layer and the planarization layer, as shown in FIGS. 11A and 11B. FIG. 11B is a sectional view taken along the direction A-A in FIG. 11A.

As shown in FIG. 11A, in an exemplary embodiment, the anode via holes K1 are provided in each sub-pixel, and the planarization layer and the fourth insulating layer in the anode via holes K1 are removed to expose a surface of the second capacitor polar plate 45. The electrode via holes K2 are arranged between the third sub-pixels P3 of two adjacent pixel units, and the planarization layer and the fourth insulating layer in the electrode via holes K2 are removed to expose a surface of the second power line 44.

In an exemplary embodiment, both the anode via holes K1 and the electrode via holes K2 may include large holes provided in the planarization layer 95 and small holes provided in the fourth insulating layer 94, and the small holes are disposed in the large holes.

As shown in FIG. 11B, after this running of the processes, the display substrate includes the first conducting layer disposed on the substrate 10, the first insulating layer 91 overlying the first conducting layer, the semiconductor layer disposed on the first insulating layer 91, the second insulating layer 92, the second conducting layer disposed on the second insulating layer 92, the third insulating layer 93 overlying the second conducting layer, the third conducting layer disposed on the third insulating layer 93, the fourth insulating layer 94 overlying the third insulating layer 93 and the planarization layer 95 overlying the fourth insulating layer 94. The anode via holes K1 and the electrode via holes K2 are provided in the fourth insulating layer 94 and the planarization layer 95. The anode via holes K1 expose the second capacitor polar plate 45 and the electrode via holes K2 expose the second power line 44.

Thus far, manufacturing of the patterns of the driving circuit layer on the substrate 10 is completed. In an exemplary implementation, the driving circuit layer of each sub-pixel at least includes the first transistor T1, the second transistor T2, the third transistor T3 and the storage capacitors.

In an exemplary implementation, the first insulating layer, the second insulating layer, the third insulating layer and the fourth insulating layer may be made of any one or more of silicon oxide (SiOx), silicon nitride (SiNx) and silicon oxynitride (SiON), and may be a single layer, multiple layers or a composite layer. The first insulating layer is referred to as a buffer layer, the second insulating layer is referred to as a gate insulating (GI) layer, the third insulating layer is referred to as an interlayer dielectric (ILD) layer, and the fourth insulating layer is referred to as a passivation (PVX) layer. The planarization film may be made of an organic material, such as resin. The first metal film, the second metal film and the third metal film may be made of metal materials, such as any one or more of silver (Ag), copper (Cu), aluminum (Al), titanium (Ti) and molybdenum (Mo), or alloy materials of the aforementioned metals, such as aluminum neodymium alloy (AlNd) or molybdenum niobium alloy (MoNb), and may be a single-layered structure or a multi-layered composite structure, such as Ti/Al/Ti, etc. The semiconductor film may be made of various materials, such as amorphous indium gallium zinc oxide (a-IGZO), zinc oxynitride (ZnON), indium zinc tin oxide (IZTO), amorphous silicon (a-Si), polycrystalline silicon (p-Si), sexithiophene, and polythiophene, that is, the present disclosure is applicable to transistors manufactured based on oxide technology, silicon technology and organic matter technology.

Figure 12A:
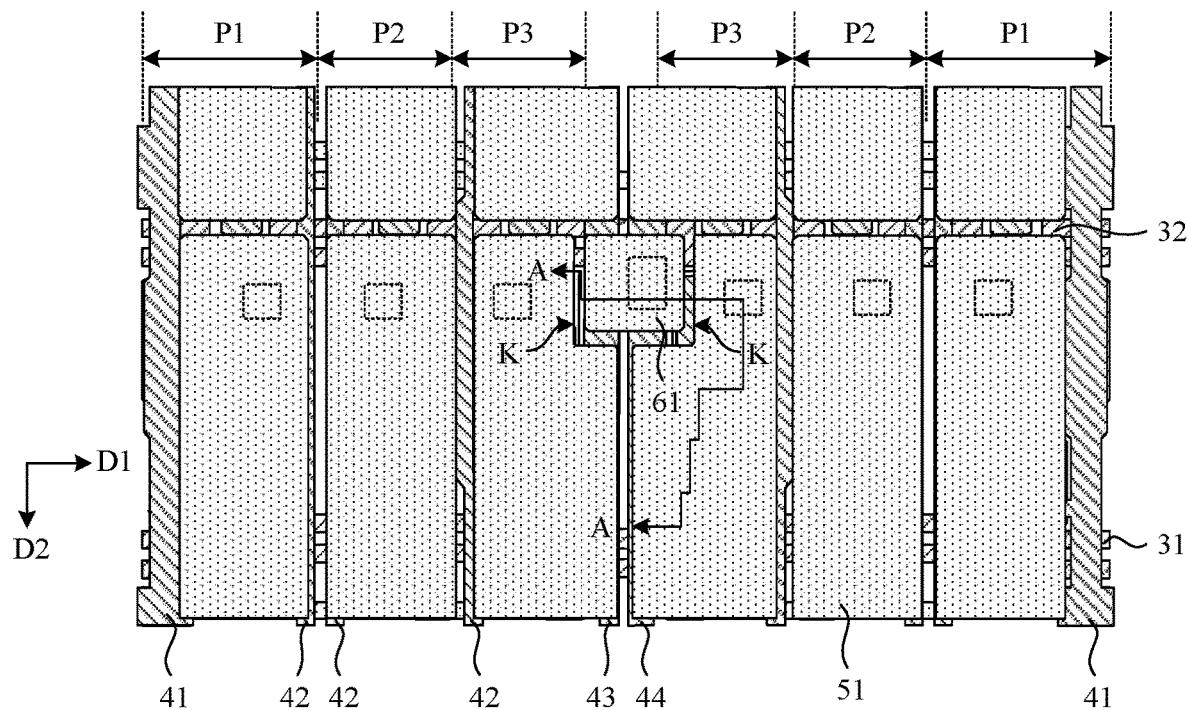
FIG. 12A is a schematic diagram that a pattern of a first transparent conducting layer is formed in accordance with an embodiment of the present disclosure.
Figure 12B:
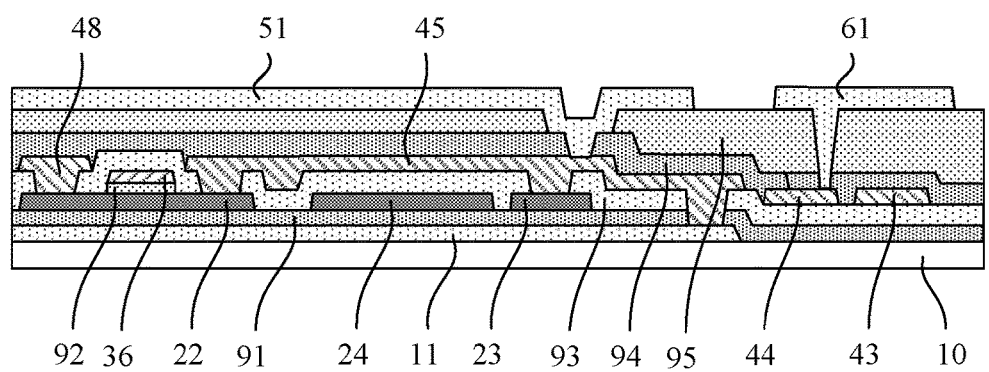
FIG. 12B is a sectional view taken along the direction A-A in FIG. 12A.

(7) A pattern of a first transparent conducting layer is formed. In an exemplary implementation, forming the pattern of the first transparent conducting layer may include: depositing a first transparent conducting film on the substrate, on which the aforementioned patterns are formed, and patterning the first transparent conducting film through the patterning processes to form the patterns of the first transparent conducting layer. The patterns of the first transparent conducting layer at least include a first anode 51 and a first auxiliary electrode 61, as shown in FIGS. 12A and 12B. FIG. 12B is a sectional view taken along the direction A-A in FIG. 12A.

In an exemplary implementation, the first anode 51 is disposed on the planarization layer and connected to the second capacitor polar plate through the anode via holes K1. The first auxiliary electrode 61 is disposed on the planarization layer and connected to the second power line 44 through the electrode via holes K2.

In an exemplary implementation, the first transparent conducting film may be made of indium tin oxide (ITO) or indium zinc oxide (IZO).

In an exemplary implementation, in a direction parallel to the display substrate, the shape of the first auxiliary electrode can be any one or more of: a triangle, a rectangle, a trapezoid, a polygon, a circle and an ellipse. Edges of the triangle, rectangle, trapezoid and polygon can be straight lines or curves, and corners of the first auxiliary electrode can be set as arcuated chamfers, which is not limited in the present disclosure.

In an exemplary implementation, on the direction parallel to the display substrate, the display substrate may include a plurality of pixel units, which are arranged sequentially along the first direction D1 and the second direction D2, respectively, and the first auxiliary electrode 61 may be arranged between two adjacent pixel units in the first direction D1, so that a plurality of sub-pixels in the two pixel units share one auxiliary electrode.

In an exemplary implementation, the first pixel unit in the two adjacent pixel units may include a first sub-pixel P1, a second sub-pixel P2 and a third sub-pixel P3 arranged sequentially along the first direction D1, and the second pixel unit may include a first sub-pixel P1, a second sub-pixel P2 and a third sub-pixel P3 arranged sequentially along the opposite direction to the first direction D1, that is, the third sub-pixels P3 of the two pixel units are adjacent to each other in the first direction D1. In an exemplary implementation, the first auxiliary electrode 61 may be disposed between two adjacent third sub-pixels P3.

In an exemplary implementation, the shape of the first anodes in the first sub-pixels P1 and the second sub-pixels P2 in the two pixel units may be a rectangle, which is similar to the shape of the sub-pixels where the first anodes are located.

In an exemplary implementation, in the second direction D2, the first anode of the third sub-pixel P3 in the first pixel unit (left side) has a first end and a second end, and the size of the first end in the first direction D1 is smaller than the size of the second end in the first direction D1. In the first direction D1, a distance between the second end and the second pixel unit is smaller than a distance between the first end and the second pixel unit.

In an exemplary implementation, in the second direction D2, the first anode of the third sub-pixel P3 in the second pixel unit (right side) has a third end and a fourth end, and the size of the third end in the first direction D1 is smaller than the size of the fourth end in the first direction D1. In the first direction D1, a distance between the fourth end and the first pixel unit is smaller than a distance between the third end and the first pixel unit.

In an exemplary implementation, the first auxiliary electrode 61 is arranged between the first end and the third end.

The shape of the first anodes in the third sub-pixels P3 of the two pixel units may be a rectangular shape with a groove K, the rectangular shape is similar to the shape of the third sub-pixels P3. The groove K is arranged at one side of the first anode 51 close to the first auxiliary electrode 61.

In an exemplary implementation, the third sub-pixel P3 of the first pixel unit (left side) includes a first anode with a first groove, and the third sub-pixel P3 of the second pixel unit (right side) includes a first anode with a second groove, and the first auxiliary electrode is arranged between the first anode with the first groove and the first anode with the second groove.

In an exemplary implementation, the first groove in the third sub-pixel P3 of the first pixel unit (left side) is arranged at one side of the first anode close to the second pixel unit, and the second groove in the third sub-pixel P3 of the second pixel unit (right side) is arranged at one side of the first anode close to the first pixel unit, so that an accommodation area, in which the first auxiliary electrode 61 is arranged, is formed between the adjacent third sub-pixels P3 of the two pixel units.

As shown in FIG. 12B, after this running of the processes, the display substrate includes the first conducting layer disposed on the substrate 10, the first insulating layer 91 overlying the first conducting layer, the semiconductor layer disposed on the first insulating layer 91, the second insulating layer 92, the second conducting layer disposed on the second insulating layer 92, the third insulating layer 93 overlying the second conducting layer, the third conducting layer disposed on the third insulating layer 93, the fourth insulating layer 94 overlying the third insulating layer 93, the planarization layer 95 overlying the fourth insulating layer 94, and the first transparent conducting layer disposed on the planarization layer 95. The first transparent conducting layer at least includes the first anode 51 and the first auxiliary electrode 61. The first anode 51 is connected to the second capacitor polar plate 45 through the anode via holes K1, and the first auxiliary electrode 61 is connected to the second power line 44 through the electrode via holes K2.

(8) Patterns of the anode and the auxiliary electrode are formed. In an exemplary implementation, forming the patterns of the anode and the auxiliary electrode may include: depositing sequentially a fourth metal film and a second transparent conducting film on the substrate, on which the aforementioned patterns are formed, and patterning the fourth metal film and the second transparent conducting film through the patterning processes to form the patterns of the second anode 52, the third anode 53, the second auxiliary electrode 62, and the third auxiliary electrode 63. The second anode 52 is disposed at one side of the first anode 51 away from the substrate and is connected to the first anode 51, the third anode 53 is disposed at one side of the second anode 52 away from the substrate and is connected to the second anode 52, the second auxiliary electrode 62 is disposed at one side of the first auxiliary electrode 61 away from the substrate and is connected to the first auxiliary electrode 61, and the third auxiliary electrode 63 is disposed at one side of the second auxiliary electrode 62 away from the substrate and is connected to the second auxiliary electrode 62. The stacked first anode 51, second anode 52, and third anode 53 form the anode 50, and the stacked first auxiliary electrode 61, second auxiliary electrode 62 and third auxiliary electrode 63 form the auxiliary electrode 60, as illustrated in FIG. 13.

In an exemplary implementation, in the plane parallel to the display substrate, the shapes of the second anode 52 and the third anode 53 are similar to the shape of the first anode 51, an orthographic projection of the second anode 52 on the substrate may be within an orthographic projection of the first anode 51 on the substrate, and the orthographic projection of the second anode 52 on the substrate may be within an orthographic projection of the third anode 53 on the substrate. In the plane parallel to the display substrate, the shapes of the second auxiliary electrode 62 and the third auxiliary electrode 63 are similar to the shape of the first auxiliary electrode 61, an orthographic projection of the second auxiliary electrode 62 on the substrate may be within an orthographic projection of the first auxiliary electrode 61 on the substrate, and the orthographic projection of the second auxiliary electrode 62 on the substrate may be within an orthographic projection of the third auxiliary electrode 63 on the substrate.

Figure 13:
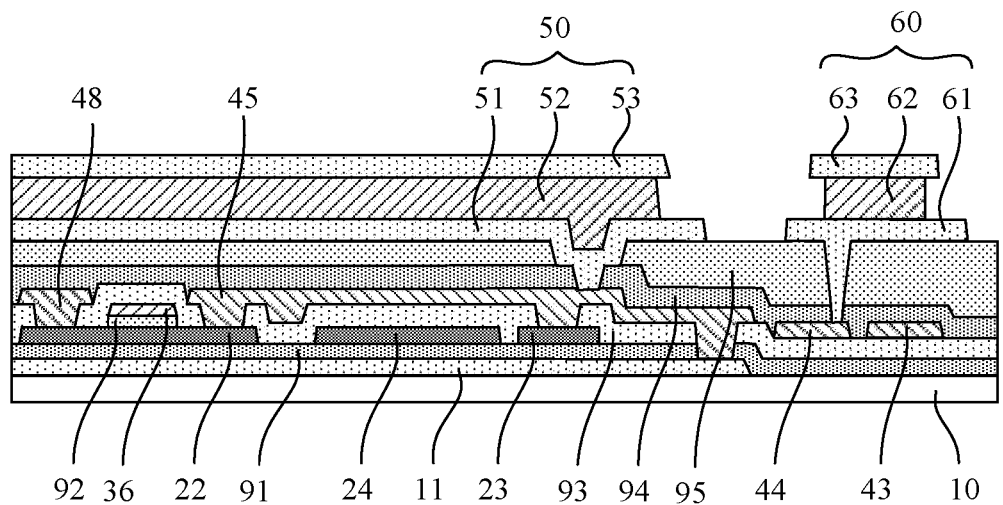
FIG. 13 is a schematic diagram that patterns of an anode and an auxiliary electrode are formed in accordance with an embodiment of the present disclosure.
Figure 14:
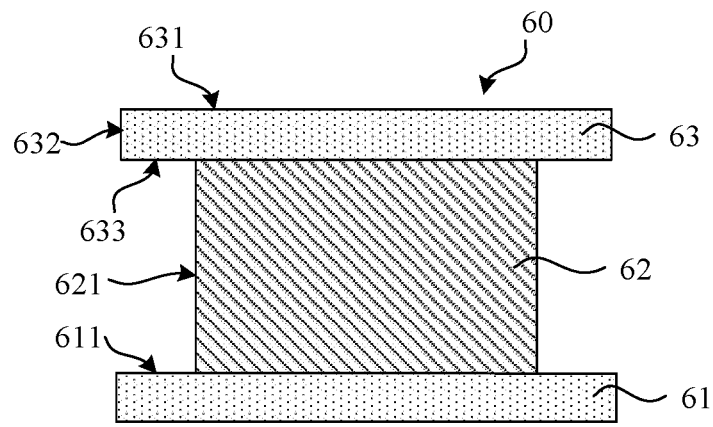
FIG. 14 is a schematic sectional view of an auxiliary electrode in accordance with an embodiment of the present invention.

FIG. 14 is a schematic sectional view of an auxiliary electrode in accordance with an embodiment of the present invention, which is an enlarged view of the auxiliary electrode in FIG. 13. As shown in FIG. 14, in the plane perpendicular to the display substrate, the first auxiliary electrode 61 located at one side (lower side) of the second auxiliary electrode 62 close to the substrate has an edge protruding from a contour of the second auxiliary electrode 62 to form a "house base" structure, and the third auxiliary electrode 63 located at one side (upper side) of the second auxiliary electrode 62 away from the substrate has an edge protruding from the contour of the second auxiliary electrode 62, and forms an "eave" structure together with the first auxiliary electrode 61, so that the stacked first auxiliary electrode 61, second auxiliary electrode 62, and third auxiliary electrode 63 form an I-shaped structure.

In an exemplary implementation, the first anode 51 located at one side (lower side) of the second anode 52 close to the substrate has an edge protruding from a contour of the second anode 52 to form a "house base" structure, and the third anode 53 located at one side (upper side) of the second anode 52 away from the substrate has an edge protruding from the contour of the second anode 52 to form an "eave" structure, so that the stacked first anode 51, second anode 52, and third anode 53 form an I-shaped structure.

In an exemplary implementation, during the patterning of the fourth metal film and the second transparent conducting film, a first etchant and a second etchant may be used to implement etching respectively, and the I-shaped structures of the auxiliary electrode and the anode are formed by drilling. In an exemplary implementation, the first etchant may be an etchant (ITO etchant) for etching a transparent conducting material, and the second etchant may be an etchant (metal etchant) for etching a metal material. In an exemplary implementation, after patterns of a photoresist are formed through masking, exposure, and development of the photoresist, the etching process may include: first etching the second transparent conducting film, which is not covered by the photoresist, using the ITO etchant, such that an area not covered by the photoresist exposes the fourth metal film to form patterns of the third anode 53 and the third auxiliary electrode 63; and then etching the exposed fourth metal film using the metal etchant to form patterns of the second anode 52 and the second auxiliary electrode 62. Because a rate at which the fourth metal film is etched by the metal etchant is greater than a rate at which the first transparent conducting film and the second transparent conducting film are etched, side surfaces of the second anode 52 and the second auxiliary electrode 62 are etched to form pits. Both the first anode 51 below the second anode 52 and the third anode 53 above the second anode 52 protrude from the second anode 52 by a certain distance, and both the first auxiliary electrode 61 below the second auxiliary electrode 62 and the third auxiliary electrode 63 above the second auxiliary electrode 62 protrude from the second auxiliary electrode 62 by a certain distance, to form the I-shaped structures.

As shown in FIG. 14, in the direction perpendicular to the display substrate, the formed auxiliary electrode has a plurality of exposed surfaces, which include: a first upper surface 611 of the first auxiliary electrode 61, which is a surface of a part of the first auxiliary electrode 61 protruding from the second auxiliary electrode 62 at a side away from the substrate, a second side surface 621 at one side of the second auxiliary electrode 62, a third upper surface 631 at the upper side (one side away from the substrate) of the third auxiliary electrode 63, a third side surface 632 at one side of the third auxiliary electrode 63, and a third lower surface 633 at the lower side (one side close to the substrate) of the third auxiliary electrode 63. The third lower surface 633 refers to a surface of a part of the third auxiliary electrode 63 protruding from the second auxiliary electrode 62 at one side close to the substrate. In an exemplary implementation, the aforementioned side surfaces refer to a plurality of circumferential surfaces, normal directions of which are parallel or nearly parallel to a plane of the substrate. For example, in the plane parallel to the substrate, the second side surface 621 of the rectangular second auxiliary electrode 62 includes four circumferential surfaces.

In an exemplary implementation, materials of the fourth metal film may include any one or more of silver (Ag), copper (Cu), aluminum (Al), titanium (TI), and molybdenum (Mo), or alloy materials of the aforementioned metals, and materials of the second transparent conducting film may be indium tin oxide (ITO) or indium zinc oxide (IZO),etc.

Figure 15A:
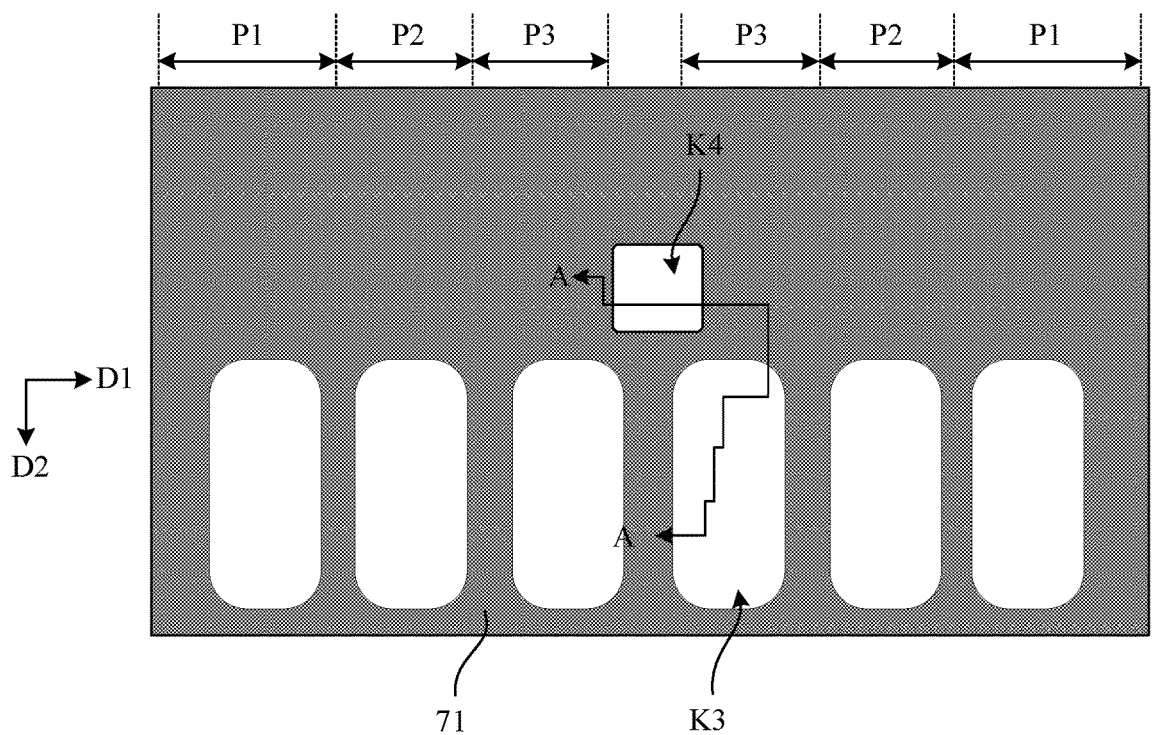
FIGS. 15A and 15B are schematic diagrams that a pattern of a pixel define layer is formed in accordance with an embodiment of the present disclosure.
Figure 15B:
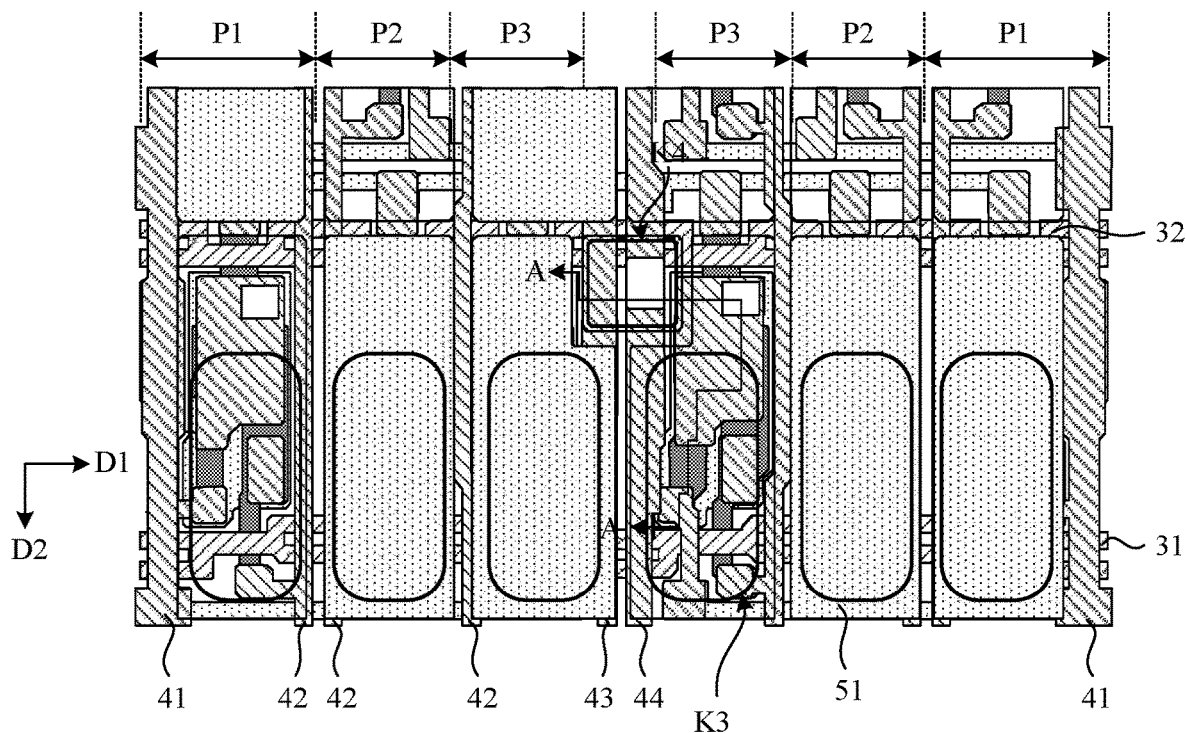
Figure 15C:
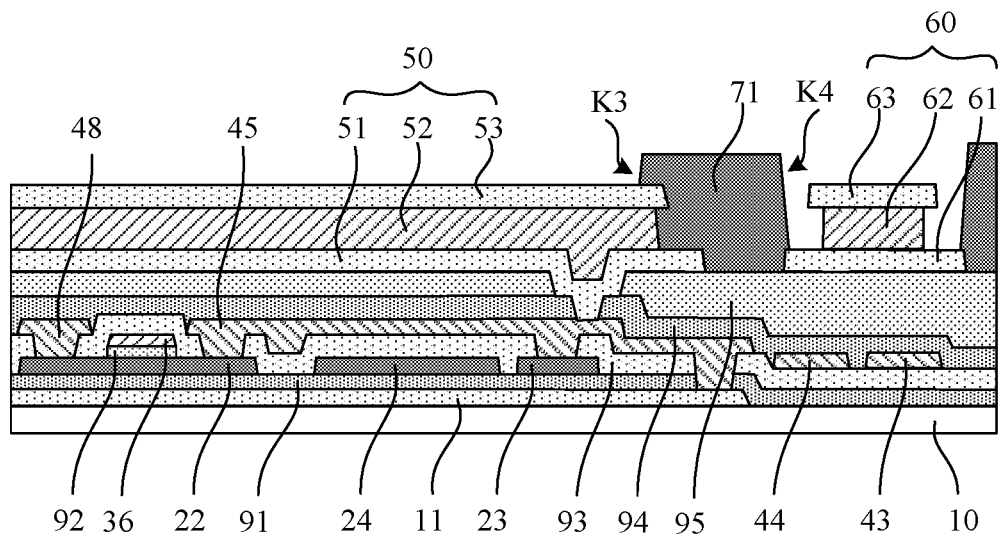
FIG. 15C is a sectional view taken along the direction A-A in FIGS. 15A and 15B.

(9) A pattern of a pixel define layer is formed. In an exemplary implementation, forming the pattern of the pixel define layer may include: coating a pixel define film on the substrate, on which the aforementioned patterns are formed, and patterning the pixel define film through the patterning processes to form the pattern of the pixel define layer (PDL) 71. The first pixel opening K3 and the second pixel opening K4 are provided in the pixel define layer 71. The pixel define layer 71 in the first pixel opening K3 is removed to expose part of the surface of the third anode 53 in the anode, and the pixel define layer 71 in the second pixel opening K4 is removed to expose all of the surfaces of the second auxiliary electrode 62 and the third auxiliary electrode 63 in the auxiliary electrode, as illustrated in FIGS. 15A, 15B and 15C. FIG. 15A is a schematic diagram of the shape of the pixel opening in the pixel define layer, FIG. 15B is a schematic diagram of the position of the pixel opening in the pixel define layer, which is configured to be transparent, and FIG. 15C is a sectional view taken along the direction A-A in FIGS. 15A and 15B.

In an exemplary implementation, an orthographic projection of the first pixel opening K3 on the substrate is within the orthographic projection of the third anode 53 on the substrate, an orthographic projection of the second pixel opening K4 on the substrate is within the orthographic projection of the first auxiliary electrode 61 on the substrate, and the orthographic projections of the second auxiliary electrode 62 and the third auxiliary electrode 63 on the substrate are within the orthographic projection of the second pixel opening K4 on the substrate. The second pixel opening exposing all of the surfaces of the second auxiliary electrode 62 and the third auxiliary electrode 63 means that the second pixel opening includes a second lower opening at one side close to the substrate and a second upper opening at the side away from the substrate, and the orthographic projections of the second auxiliary electrode 62 and the third auxiliary electrode 63 on the substrate are within an orthographic projection of the second lower opening on the substrate.

In an exemplary implementation, the pixel define layer may be made of polyimide, acrylic or polyethylene terephthalate. In the plane parallel to the display substrate, the shape of the first pixel opening K3 may be an ellipse, and the shape of the second pixel opening K4 may be a rectangle. In the plane perpendicular to the display substrate, the sectional shapes of the first pixel opening K3 and the second pixel opening K4 may be a rectangle or a trapezoid.

Figure 16:
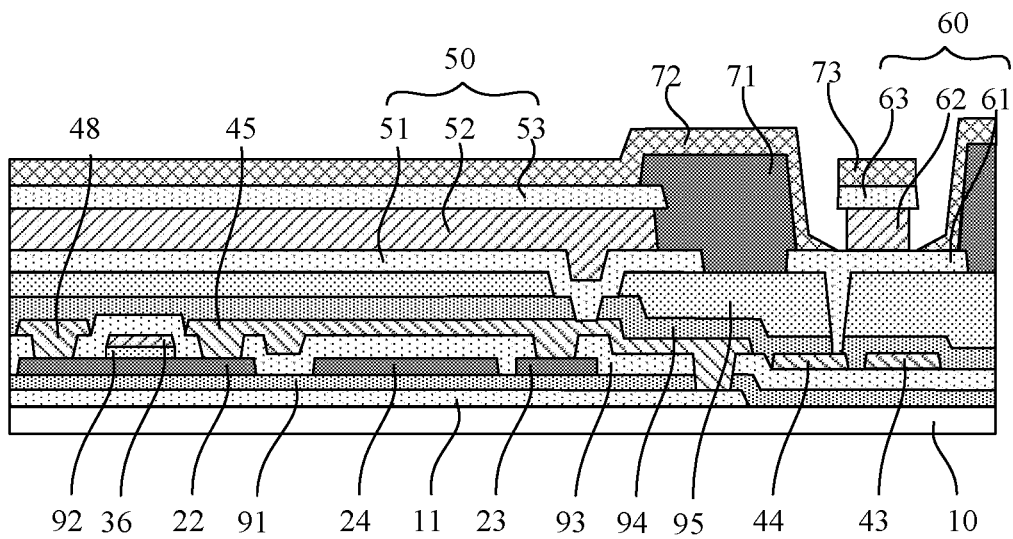
FIG. 16 is a schematic diagram that a pattern of an organic light emitting layer is formed in accordance with an embodiment of the present disclosure.

(10) A pattern of an organic light emitting layer is formed. In an exemplary implementation, forming the pattern of the organic light emitting layer may include: evaporating an organic light emitting material on the substrate, on which the aforementioned patterns are formed, to form the patterns of the organic light emitting layer 72 and patterns of an organic light emitting block 73. The organic light emitting layer 72 is disposed in areas except an area where the third auxiliary electrode 63 is located, the organic light emitting layer 72 is connected to the third anode 53 in the anode 50 through the first pixel opening K3, the organic light emitting block 73 is arranged on a surface at one side of the third auxiliary electrode 63 away from the substrate, and the organic light emitting block 73 is arranged to be isolated from the organic light emitting layer 72, as illustrated in FIG. 16.

In an exemplary implementation, due to the I-shaped structure of the auxiliary electrode, the third auxiliary electrode 63 protrudes from the second auxiliary electrode 62 by a certain distance, thus the organic light emitting material is broken on an edge of the side surface of the third auxiliary electrode 63, to form the organic light emitting block 73 on the second upper surface 631 of the third auxiliary electrode 63 and form the organic light emitting layer 72 in areas except an area where the third auxiliary electrode 63 is located, thereby achieving the mutual isolation of the organic light emitting layer 72 and the organic light emitting block 73. In an exemplary implementation, an orthographic projection of the organic light emitting block 73 on the substrate may be approximately equal to the orthographic projection of the third auxiliary electrode 63 on the substrate. The isolated and separated organic light emitting block is formed by separating the organic light emitting layer using the I-shaped structure of the auxiliary electrode, to avoid the interference of organic light emitting block with emitted light effectively, thereby improving the quality of the emitted light and facilitating the improvement of the display quality.

In an exemplary implementation, the organic light emitting layer 72 is connected to the third anode 53 through the first pixel opening K3, thus the connection between the organic light emitting layer 72 and the anode 50 is implemented. One portion of the organic light emitting layer 72 located in an area of the second pixel opening K4 overlies a sidewall of the second pixel opening K4, while the other portion overlies a portion of a bottom surface of the second pixel opening K4, and forms a slope on the bottom surface of the second pixel opening K4. In an exemplary implementation, the organic light emitting layer 72 located on the bottom surface of the second pixel opening K4 is at a certain distance from the second auxiliary electrode 62, and an area between the organic light emitting layer 72 and the second auxiliary electrode 62 exposes the first auxiliary electrode 61.

In an exemplary implementation, the organic light emitting layer may include a light emitting layer (EML) and any one or more of: a hole injection layer (HIL), a hole transport layer (HTL), an electron block layer (EBL), a hole block layer (HBL), an electron transport layer (ETL), and an electron injection layer (EIL). In an exemplary implementation, the organic light emitting layer may be formed by evaporation using a fine metal mask (FMM) or an open mask, or formed by an ink jet process.

In an exemplary implementation, the organic light emitting layer may be manufactured by the following manufacture method. The hole injection layer and the hole transport layer are formed sequentially by evaporation using the open mask first, and a common layer of the hole injection layer and the hole transport layer is formed on the display substrate. Then, the electron block layer and a red light emitting layer are formed by evaporation in a red sub-pixel using the fine metal mask, the electron block layer and a green light emitting layer are formed by evaporation in a green sub-pixel, and the electron block layer and a blue light emitting layer are formed by evaporation in a blue sub-pixel. There may be slight overlap between the electron block layers and the light emitting layers of the adjacent sub-pixels (for example, the overlap area accounts for less than 10% of the area of patterns of the respective light emitting layer), or the electron block layers may be isolated from the light emitting layers. Then, the hole block layer, the electron transport layer, and the electron injection layer are formed by sequential evaporation using the open mask, and a common layer of the hole block layer, the electron transport layer, and the electron injection layer is formed on the display substrate.

In an exemplary implementation, the electron block layer may be used as a microcavity regulating layer of a light emitting device. By designing the thickness of the electron block layer, the thickness of the organic light emitting layer between the cathode and the anode can satisfy the design for the length of a microcavity. In some exemplary implementations, the hole transport layer, the hole block layer, or the electron transport layer in the organic light emitting layer may be used as the microcavity adjustment layer of the light emitting device, which is not limited herein in the present disclosure.

In an exemplary implementation, the light emitting layer may include a host material and a dopant material doped into the host material. A doping ratio of the dopant material in the light emitting layer is 1% to 20%. Within the doping ratio, on one hand, the host material in the light emitting layer can be used to effectively transfer exciton energies to the dopant material in the light emitting layer to excite the dopant material in the light emitting layer to emit light; on the other hand, the host material in the light emitting layer is used to "dilute" the dopant material in the light emitting layer, so as to alleviate effectively the collision between molecules of the dopant material in the light emitting layer and the fluorescence quenching caused by collision between the energies, improving the luminous efficiency and device life. In an exemplary implementation, the doping ratio refers to a ratio of the mass of the dopant material to the mass of the light emitting layer, that is, a mass percentage. In an exemplary implementation, the host material and the dopant material can be evaporated together through a multi-source evaporation process, so that the host material and the dopant material are uniformly dispersed in the light emitting layer. The doping ratio may be adjusted by controlling an evaporation rate of the dopant material, or by controlling an evaporation rate of the host material and an evaporation rate of the dopant material during the evaporation process. In an exemplary implementation, the thickness of the light emitting layer may be about 10 nm to 50 nm.

In an exemplary implementation, the hole injection layer may be made of an inorganic oxide, such as molybdenum oxide, titanium oxide, vanadium oxide, rhenium oxide, ruthenium oxide, chromium oxide, zirconium oxide, hafnium oxide, tantalum oxide, silver oxide, tungsten oxide or manganese oxide, or may be made of a p-type dopant of a strong electron absorption system and a dopant of a hole transport material. In an exemplary implementation, the thickness of the hole injection layer may be about 5 nm to 20 nm.

In an exemplary implementation, the hole transport layer may be made of a material with high hole mobility, such as an aromatic amine compound, a substituent group of which may be carbazole, methylfluorene, spirofluorene, dibenzothiophene or furan. In an exemplary implementation, the thickness of the hole transport layer may be about 40 nm to 150 nm.

In an exemplary implementation, the hole block layer and the electron transport layer may be made of aromatic heterocyclic compounds, such as imidazole derivatives such as benzimidazole derivatives, imidazopyridine derivatives, and benzimidazole phenanthridine derivatives; oxazine derivatives such as pyrimidine derivatives and triazine derivatives; compounds having nitrogen-containing hexatomic ring structure (also including compounds having substituent groups of phosphine oxide systems on heterocyclic rings) such as quinoline derivatives, isoquinoline derivatives, phenanthroline derivatives, etc. In an exemplary implementation, the thickness of the hole block layer may be about 5 nm to 15 nm, and the thickness of the electron transport layer may be about 20 nm to 50 nm.

In an exemplary implementation, the electron injection layer may be made of alkali metals or metals such as lithium fluoride (LiF), ytterbium (Yb), magnesium (Mg) or calcium (ca), or compounds of these alkali metals or metals. In an exemplary implementation, the thickness of the electron injection layer may be about 0.5 nm to 2 nm.

(11) A pattern of a cathode is formed. In an exemplary implementation, forming the pattern of the cathode may include: evaporating a cathode material by on the substrate, on which the aforementioned patterns are formed, to form the pattern of the cathode 80. The cathode 80 is connected to the organic light emitting layer 72, and a large-area contact connection between the cathode 80 and the auxiliary electrode 60 is implemented by wrapping the organic light emitting block 73 and the auxiliary electrode 60, as illustrated in FIG. 17.

In an exemplary implementation, the cathode 80 may be a connected integral structure. In areas except an area where the auxiliary electrode 60 is located, the cathode 80 is disposed on the organic light emitting layer 72. In the area where the auxiliary electrode 60 is located, the cathode 80 is disposed on the exposed surface of the organic light emitting block 73 on one hand, and on the exposed surface of the auxiliary electrode on the other hand, to form a structure wrapping the auxiliary electrode 60 and the organic light emitting block 73.

Figure 17:
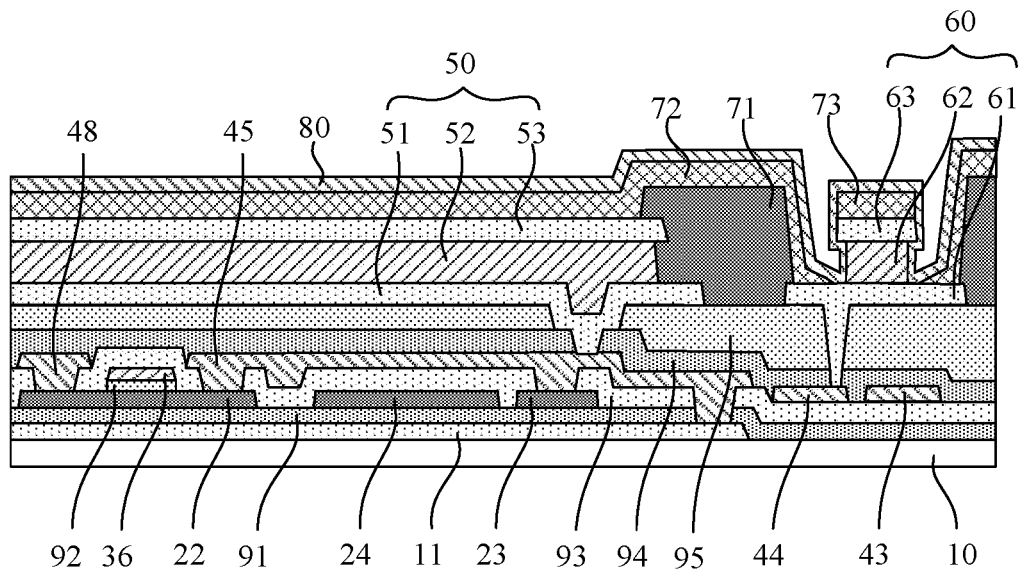
FIG. 17 is a schematic diagram that a pattern of a cathode is formed in accordance with an embodiment of the present disclosure.

As shown in FIGS. 14 and 17, for the organic light emitting block 73, one portion of the cathode 80 overlies or partially overlies a surface at one side of the organic light emitting block 73 away from the substrate, and the other portion of the cathode 80 overlies or partially overlies a side surface of the organic light emitting block 73. For the third auxiliary electrode 63, the organic light emitting block 73 overlies or partially overlies a surface at one side of the third auxiliary electrode 63 away from the substrate, a portion of the cathode 80 overlies or partially overlies a second side surface 632 of the third auxiliary electrode 63, and the other portion of the cathode 80 overlies or partially overlies a second lower surface 633 at the lower side of the third auxiliary electrode 63, that is, the cathode 80 overlies or partially overlies a lower surface of the third auxiliary electrode 63 protruding from the second auxiliary electrode 62. Thus, not only a connection between the cathode 80 and the third auxiliary electrode 63 is implemented, but also wrapping of the organic light emitting block 73 is implemented. Because the cathode 80 is connected to the third auxiliary electrode 63 through the third side surface 632 and the third lower surface 633, a potential of the cathode 80 at the upper side of the organic light emitting block 73 is equal to that of the third auxiliary electrode 63 at the lower side of the organic light emitting block 73, that is, the potentials at both the upper side and the lower side of the organic light emitting block 73 are equal, so as to ensure that the organic light emitting block 73 will not emit light, avoiding a flicker phenomenon caused by light emission of the organic light emitting block 73. For the second auxiliary electrode 62, the cathode 80 overlies or partially overlies the second side surface 621 at one side of the second auxiliary electrode 62. For the first auxiliary electrode 61, the cathode 80 overlies or partially overlies the first auxiliary electrode 61 exposed between the organic light emitting layer 72 and the second auxiliary electrode 62.

In the exemplary embodiments of the present disclosure, a contact area between the cathode and the auxiliary electrode is effectively increased through the contact connection between the cathode and the side surface of the second auxiliary electrode, thereby effectively reducing the resistance at the contact interface and improving the display effect.

Thus far, a pattern of a light emitting structure layer is manufactured on the driving circuit layer. The light emitting structure layer includes the anode, the auxiliary electrode, the pixel define layer, the organic light emitting layer and the cathode. The organic light emitting layer is connected to the anode and the cathode respectively, the cathode is connected to the auxiliary electrode, and the auxiliary electrode is connected to the second power line.

In an exemplary implementation, the process of manufacturing the display substrate may include forming a pattern of an encapsulation layer. Forming the pattern of the encapsulation layer pattern may include: first depositing a first inorganic film by means of plasma enhanced chemical vapor deposition (PECVD) through the open mask to form a first encapsulation layer; then printing an organic material on the first encapsulation layer through an ink-jet printing process, and curing it into a film to form a second encapsulation layer; and subsequently depositing a second inorganic film using the open mask to form a third encapsulation layer. The first encapsulation layer, the second encapsulation and the third encapsulation layer form the encapsulation layer. In an exemplary embodiment, the first encapsulation layer and the third encapsulation layer may be made of any one or more of silicon oxide (SiOx), silicon nitride (SiNx), and silicon nitride (SiON), and may be a single layer, multiple layers or a composite layer. The second encapsulation layer may be made of a resin material to form a stacked structure of inorganic material/organic material/inorganic material. The organic material layer is disposed between the two inorganic material layers, so as to ensure that external water vapor cannot enter the light emitting structure layer.

In an exemplary implementation, after the manufacturing of the encapsulation layer is completed, a touch structure layer (TSP) may be formed on the encapsulation layer. The touch structure layer may include a touch electrode layer, or include a touch electrode layer and a touch insulating layer.

In an exemplary implementation, during the manufacturing for a flexible display substrate, the process of manufacturing the display substrate may include processes such as stripping a glass carrier plate, attaching a back film, and cutting, which is not limited in the present disclosure.

It can be seen from the structure of the display substrate and the manufacturing process thereof in accordance with the exemplary embodiments of the present disclosure that in the direction perpendicular to the display substrate, according to the exemplary embodiments of the present disclosure, by configuring the I-shaped section of the auxiliary electrode, the organic light emitting layer is broken at the edge of the auxiliary electrode and is isolated from the organic light emitting block above the auxiliary electrode, so as to avoid the interference of the organic light emitting block's with the emitted light, thereby improving the quality of the emitted light and facilitating the improvement of the display quality. In the direction perpendicular to the display substrate, according to the exemplary embodiments of the present disclosure, same potential at both sides of the organic light emitting block is implemented by configuring the third auxiliary electrode of the auxiliary electrode to protrude from the second auxiliary electrode and connecting the cathode with the third auxiliary electrode, so as to ensure that the organic light emitting block will not emit light, thereby avoiding the flicker phenomenon caused by light emission of the organic light emitting block. According to the exemplary embodiments of the present disclosure, the contact area between the cathode and the auxiliary electrode is effectively increased by providing the contact connection between the cathode and the side surface of the auxiliary electrode, thereby reducing the resistance at the contact interface and improving the display effect. Since a laser drilling process is not used in the method of manufacturing the display substrate in accordance with the exemplary embodiment of the present disclosure, not only the tact time is shortened, but also particles will not be generated in the manufacturing process, thus improving the production efficiency and product yield rate. The method of manufacturing the display substrate in accordance with the exemplary embodiment of the present disclosure has excellent process compatibility, is simple in process realization, is easy to implement, and has high production efficiency, low production cost and high field rate.

In an exemplary implementation, the display substrate may be manufactured by another manufacturing method. Another process of manufacturing the display substrate may include the following operations.

(21) The processes of manufacturing the substrate and the driving circuit layer are the same as those in the previous embodiments, and will not be repeated herein.

Figure 18:
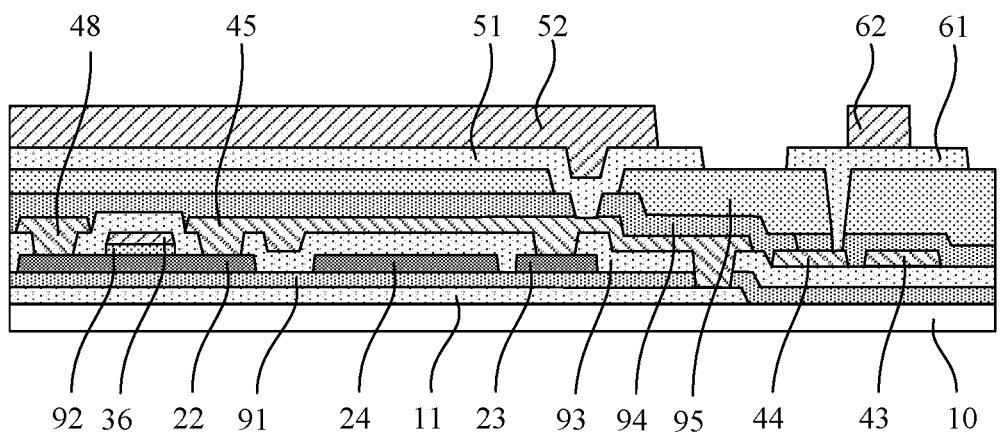
FIG. 18 is another schematic diagram that patterns of an anode and an auxiliary electrode are formed in accordance with an embodiment of the present disclosure.

(22) Patterns of the first transparent conducting layer and a fourth metal layer are formed. In an exemplary implementation, forming the patterns of the first transparent conducting layer and the fourth metal layer may include: depositing sequentially a first transparent conducting film and a fourth metal film on the substrate, on which the aforementioned patterns are formed, and patterning the first transparent conducting film and the fourth metal film through the patterning processes to form the patterns of the first transparent conducting layer and the fourth metal layer. In an exemplary implementation, the pattern of the first conducting layer at least includes the first anode 51 and the first auxiliary electrode 61. The first anode 51 is connected to the second capacitor polar plate 45 through the anode via holes, and the first auxiliary electrode 61 is connected to the second power line 44 through the electrode via holes. The fourth metal layer at least includes the second anode 52 and the second auxiliary electrode 62. The second anode 52 is arranged at one side of the first anode 51 away from the substrate and is connected to the first anode 51, and the second auxiliary electrode 62 is arranged at one side of the first auxiliary electrode 61 away from the substrate and is connected to the first auxiliary electrode 61, as illustrated in FIG. 18.

In an exemplary implementation, the first transparent conducting film and the fourth metal film may be patterned through a patterning process, such as a halftone mask or graytone mask. For example, the patterning can include: coating a layer of positive photoresist on the fourth metal film, and exposing the photoresist using the halftone mask or graytone mask to form fully exposed areas, partially exposed areas and unexposed areas; then, performing a development process, such that the photoresist in the unexposed areas is retained and the photoresist has a first thickness, and a certain thickness of the photoresist in the partially exposed areas is removed and the photoresist has a second thickness, the second thickness being less than the first thickness, and all the photoresist in the fully exposed areas being removed to expose the surface of the fourth metal film; then performing the first etching treatment to etch away the first transparent conducting film and the fourth metal film in the fully exposed areas to form the patterns of the first cathode 51 and the first auxiliary electrode 61; subsequently performing ashing treatment to remove the photoresist with the second thickness in the partially exposed area, to expose the surface of the fourth metal film; and then performing the second etching treatment to etch away the fourth metal film in the partially exposed area, to form the patterns of the second anode 52 and the second auxiliary electrode 62.

(23) Patterns of the third anode and the third auxiliary electrode are formed. In an exemplary implementation, forming the patterns of the third anode and the third auxiliary electrode may include: depositing a second transparent conducting film on the substrate, on which the aforementioned patterns are formed, and patterning the second transparent conducting film through the patterning processes to form the patterns of the third anode 53 and the third auxiliary electrode 63. The third anode 53 is arranged at one side of the second anode 52 away from the substrate and is connected to the second anode 52, and the third auxiliary electrode 63 is arranged at one side of the second auxiliary electrode 62 away from the substrate and is connected to the second auxiliary electrode 62. The stacked first anode 51, second anode 52, and third anode 53 form the anode 50, and the stacked first auxiliary electrode 61, second auxiliary electrode 62 and third auxiliary electrode 63 form the auxiliary electrode 60, as illustrated in FIG. 13.

In an exemplary implementation, during the patterning the second transparent conducting film, the first etchant and the second etchant may be used separately for etching the second transparent conducting film, to form the I-shaped structure of the auxiliary electrode and the I-shaped structure of the anode by drilling. In an exemplary implementation, the first etchant may be an etchant (ITO etchant) for etching a transparent conducting material, and the second etchant may be an etchant (metal etchant) for etching a metal material. In an exemplary implementation, the etching process may include: first etching the second transparent conducting film using the ITO etchant, to form the patterns of the third anode 53 and the third auxiliary electrode 63; and then continuing the etching using the metal etchant. Because a rate at which the second anode 52 and the second auxiliary electrode 62 are etched using the metal etchant is greater than a rate at which the third anode 53 and the third auxiliary electrode 63 are etched, side surfaces of the second anode 52 and the second auxiliary electrode 62 are etched to form pits. Both the first anode 51 below the second anode 52 and the third anode 53 above the second anode 52 protrude from the second anode 52 by a certain distance to form the I-shaped structure. Both the first auxiliary electrode 61 below the second auxiliary electrode 62 and the third auxiliary electrode 63 above the second auxiliary electrode 62 protrude from the second auxiliary electrode 62 by a certain distance to form the I-shaped structure.

(24) Processes of forming the pixel define layer, the organic light emitting layer, and the cathode are the same as those in the previous embodiments, and will not be repeated herein.

As shown in FIGS. 5 to 18, the display substrate manufactured by the aforementioned manufacturing process may include: the substrate 10; the first conducting layer disposed on the substrate 10, the first conducting layer including at least the shielding layer 11; the first insulating layer 91 overlying the first conducting layer; the semiconductor layer disposed on the first insulating layer 91, the semiconductor layer including at least the first capacitor polar plate 24 and active layers of a plurality of transistors; the second insulating layer 92 disposed on the semiconductor layer; the second conducting layer disposed on the second insulating layer 92, the second conducting layer including at least gate electrodes of the plurality of transistors; the third insulating layer 93 overlying the second conducting layer; the third conducting layer disposed on the third insulating layer 93, the third conducting layer including at least the second power line 44, the second capacitor polar plate 45 and the first electrode and second electrode of the plurality of transistors, the second capacitor polar plate 45 being connected to the shielding layer 11 through the via holes, the second capacitor polar plate 45 and the first capacitor polar plate 24 forming the first storage capacitor, and the shielding layer 11 and the first capacitor polar plate 24 forming the second storage capacitor; the fourth insulating layer 94 overlying the third conducting layer; the planarization layer 95 disposed on the fourth insulating layer 94; the anode 50 and the auxiliary electrode 60 disposed on the planarization layer 95, the anode 50 including the first anode 51, the second anode 52 and the third anode 53 which are stacked and form the I-shaped structure, and the auxiliary electrode 60 including the first auxiliary electrode 61, the second auxiliary electrode 62 and the third auxiliary electrode 63 which are stacked and form the I-shaped structure; the pixel define layer 71 disposed on the planarization layer 95, the first pixel opening and the second pixel opening being provided in the pixel define layer 71, the first pixel opening exposing the third anode 53, and the second pixel opening exposing the second auxiliary electrode 62 and the third auxiliary electrode 63; the organic light emitting layer 72 disposed on the pixel define layer 71 and the organic light emitting block 73 arranged on the third auxiliary electrode 63, the organic light emitting layer 72 being connected to the third anode 53 through the first pixel opening, and the organic light emitting block 73 being arranged to be isolated from the organic light emitting layer 72; the cathode 80 arranged on the organic light emitting layer 72, the cathode 80 being connected to the organic light emitting layer 72 and implementing the large-area contact connection with the auxiliary electrode 40 by wrapping the organic light emitting block 73 and the auxiliary electrode 40; and the encapsulation layer disposed on the cathode 80, the encapsulation layer including the first encapsulation layer, the second encapsulation layer and the third encapsulation layer stacked.

The structure and the manufacturing process thereof in accordance with the exemplary embodiments of the present disclosure are only described exemplarily. In an exemplary implementation, the corresponding structure may be altered and the patterning processes may be increased or decreased according to the actual needs. For example, the transistor in the driving circuit layer may be a top gate structure. As another example, other film layer structures, electrode structures, or lead structures may further be provided in the driving circuit layer and the light emitting structure layer. As a further example, the substrate may be a glass substrate, which is not limited specifically in the present disclosure.

The present disclosure further provides a method for manufacturing a display substrate. In an exemplary implementation, the method may include:

forming a driving circuit layer on a substrate; and forming a light emitting structure layer on the driving circuit layer, wherein the light emitting structure layer includes an anode, an organic light emitting layer, an organic light emitting block, a cathode and an auxiliary electrode, the organic light emitting layer is connected to the anode and the cathode respectively, the auxiliary electrode includes a bottom surface at one side close to the substrate, a top surface at the side away from the substrate and a side surface arranged between the bottom surface and the top surface, the cathode is in contact with the side surface of the auxiliary electrode, the organic light emitting block is arranged on the top surface of the auxiliary electrode at one side away from the substrate, and the organic light emitting block is arranged to be isolated from the organic light emitting layer.

In the method of manufacturing the display substrate provided by the present disclosure, by configuring the I-shaped section of the auxiliary electrode, the organic light emitting layer is broken at the edge of the auxiliary electrode and is isolated from the organic light emitting block above the auxiliary electrode, so as to avoid the organic light emitting block's interference with the emitted light, thereby improving the quality of the emitted light and facilitating the improvement of the display quality. Same potential at both sides of the organic light emitting block is implemented by configuring the third auxiliary electrode of the auxiliary electrode to protrude from the second auxiliary electrode and connecting the cathode, so as to ensure that the organic light emitting block will not emit light, thereby avoiding the flicker phenomenon caused by light emission of the organic light emitting block. According to the exemplary embodiments of the present disclosure, the contact area between the cathode and the auxiliary electrode is effectively increased by providing the contact connection between the cathode and the side surface of the auxiliary electrode, thereby reducing the resistance at the contact interface and improving the display effect. Because a laser drilling process is not used in the method of manufacturing the display substrate in accordance with the exemplary embodiment of the present disclosure, not only the tact time is shortened, but also particles will not be generated in the manufacturing process, thus improving the production efficiency and product yield rate. The method of manufacturing the display substrate in accordance with the exemplary embodiment of the present disclosure has excellent process compatibility, is simple in process realization, is easy to implement, and has high production efficiency, low production cost and high field rate.

The present disclosure further provides a display device which includes the display substrate in accordance with the aforementioned embodiments. The display device may be any product or component with a display function, such as a mobile phone, a tablet computer, a television, a display, a notebook computer, a digital photo frame, or a navigator.

Although the implementations of the present disclosure are disclosed as above, the contents described are used to only easily understand the implementations of the present disclosure, and are not intended to limit the present disclosure. Those skilled in the art may make any modification and alternation in forms of implementation and details of implementation without departing from the spirit and scope of the present disclosure. However, the scope of patent protection of the present disclosure should still be subject to the scope defined by the appended claims.

The invention claimed is:

1. A display substrate, comprising:

a driving circuit layer disposed on a substrate and a light emitting structure layer disposed at one side of the driving circuit layer away from the substrate, wherein the light emitting structure layer comprises an anode, an organic light emitting layer, an organic light emitting block, a cathode and an auxiliary electrode, the organic light emitting layer is connected to the anode and the cathode respectively, the auxiliary electrode comprises a bottom surface at a side close to the substrate, a top surface at a side away from the substrate and a side surface arranged between the bottom surface and the top surface, the cathode is in contact with the side surface of the auxiliary electrode, the organic light emitting block is arranged on a side of the top surface of the auxiliary electrode away from the substrate, and the organic light emitting block is arranged to be isolated from the organic light emitting layer, wherein in a direction perpendicular to the display substrate, the auxiliary electrode comprises a first auxiliary electrode, a second auxiliary electrode disposed at one side of the first auxiliary electrode away from the substrate, and a third auxiliary electrode disposed at one side of the second auxiliary electrode away from the substrate, in the direction perpendicular to the display substrate, the first auxiliary electrode, the second auxiliary electrode and the third auxiliary electrode which are stacked form to an "I" shaped structure, the second auxiliary electrode is sandwiched between the first auxiliary electrode and the third auxiliary electrode, an orthographic projection of whole of the second auxiliary electrode, in a plane parallel to the display substrate, on the substrate is within an orthographic projection of whole of the first auxiliary electrode, in the plane parallel to the display substrate, on the substrate, and within an orthographic projection of whole of the third auxiliary electrode, in the plane parallel to the display substrate, on the substrate, wherein the cathode is in direct contact with one side of the organic light emitting block away from the substrate, in direct contact with the second auxiliary electrode and in direct contact with the third auxiliary electrode, wherein the second auxiliary electrode comprises a second side surface, a normal direction of the second side surface is parallel or nearly parallel to a plane of the substrate, the third auxiliary electrode comprises a third lower surface and a third side surface, the third lower surface is protruded from the second auxiliary electrode and at a side close to the substrate; and a normal direction of the third side surface is parallel or nearly parallel to the plane of the substrate, and the organic light emitting block comprises a fourth upper surface at a side away from the substrate and a fourth side surface, a normal direction of the fourth side surface is parallel or nearly parallel to the plane of the substrate; the cathode is in direct contact with the second side surface, the cathode is in direct contact with the third lower surface and the third side surface, and the cathode is in direct contact with the fourth upper surface and the fourth side surface, wherein in a direction parallel to the display substrate, the display substrate comprises a plurality of pixel units, which are arranged sequentially along a first direction and a second direction, respectively, the first direction intersecting the second direction; the plurality of pixel units comprises at least one first pixel unit and a second pixel unit adjacent to the first pixel unit in the first direction; the auxiliary electrode is arranged between the first pixel unit and the second pixel unit, wherein the first pixel unit comprises a first sub-pixel, a second sub-pixel and a third sub-pixel arranged sequentially along the first direction, and the second pixel unit comprises a first sub-pixel, a second sub-pixel and a third sub-pixel arranged sequentially along a direction opposite to the first direction; the auxiliary electrode is arranged between the third sub-pixel of the first pixel unit and the third sub-pixel of the second pixel unit, and wherein the third sub-pixel of the first pixel unit comprises a first anode with a first groove, and the third sub-pixel of the second pixel unit comprises a first anode with a second groove, and the first auxiliary electrode is arranged between the first anode with the first groove and the first anode with the second groove.

2. The display substrate according to claim 1, wherein the organic light emitting block is disposed on a same layer and is made of same materials as the organic light emitting layer, the organic light emitting block is disposed at one side of the third auxiliary electrode away from the substrate, and an orthographic projection of the organic light emitting block on the substrate is within the orthographic projection of the third auxiliary electrode on the substrate.

3. The display substrate according to claim 1, wherein materials of the second auxiliary electrode comprise any one or more of silver, copper, aluminum, titanium and molybdenum, or alloy materials of silver, copper, aluminum, titanium and molybdenum, and materials of the first auxiliary electrode and the third auxiliary electrode comprise any one or more of indium tin oxide and indium zinc oxide.

4. The display substrate according to claim 1, wherein the anode comprises a first anode, a second anode arranged at one side of the first anode away from the substrate, and a third anode arranged at one side of the second anode away from the substrate, an orthographic projection of the second anode on the substrate is within an orthographic projection of the first anode on the substrate, and the orthographic projection of the second anode on the substrate is within an orthographic projection of the third anode on the substrate.

5. The display substrate according to claim 4, wherein the first anode is arranged on a same layer and is made of same materials as the first auxiliary electrode; the second anode is arranged on a same layer and is made of same materials as the second auxiliary electrode; the third anode is arranged on a same layer and is made of same materials as the third auxiliary electrode.

6. The display substrate according to claim 4, wherein the light emitting structure layer further comprises a pixel define layer overlying at least one portion of the first auxiliary electrode, a first pixel opening and a second pixel opening are provided in the pixel define layer, the first pixel opening exposes part of a surface of the third anode, and the second pixel opening exposes the second auxiliary electrode and the third auxiliary electrode.

7. The display substrate according to claim 1, wherein in the direction perpendicular to the display substrate, the driving circuit layer comprises a first conducting layer, a semiconductor layer, a second conducting layer and a third conducting layer which are disposed sequentially on the substrate, wherein the first conducting layer at least comprises a shielding layer, the semiconductor layer at least comprises a first capacitor polar plate and active layers of a plurality of transistors, the second conducting layer at least comprises gate electrodes of the plurality of transistors, and the third conducting layer at least comprises a second power line, a second capacitor polar plate and first electrodes and second electrodes of the plurality of transistors.

8. The display substrate according to claim 7, wherein the second capacitor polar plate is connected to the shielding layer through via holes, the second capacitor polar plate and the first capacitor polar plate form a first storage capacitor, and the shielding layer and the first capacitor polar plate form a second storage capacitor; the first auxiliary electrode in the auxiliary electrode is connected to the second power line through electrode via holes, and the first anode in the anode is connected to the second capacitor polar plate through anode via holes.

9. The display substrate according to claim 1, wherein in the second direction, the anode of the third sub-pixel in the first pixel unit has a first end and a second end, and the anode of the third sub-pixel in the second pixel unit has a third end and a fourth end; a size of the first end in the first direction is smaller than a size of the second end in the first direction, and a size of the third end in the first direction is smaller than a size of the fourth end in the first direction.

10. The display substrate according to claim 9, wherein in the first direction, a distance between the second end and the second pixel unit is smaller than a distance between the first end and the second pixel unit, a distance between the fourth end and the first pixel unit is smaller than a distance between the third end and the first pixel unit, and the auxiliary electrode is arranged between the first end and the third end.

11. A display device, comprising the display substrate according to claim 1.

12. A method for manufacturing a display substrate, comprising:
    forming a driving circuit layer on a substrate; and
    forming a light emitting structure layer on the driving circuit layer, wherein the light emitting structure layer comprises an anode, an organic light emitting layer, an organic light emitting block, a cathode and an auxiliary electrode, the organic light emitting layer is connected to the anode and the cathode respectively, the auxiliary electrode comprises a bottom surface at a side close to the substrate, a top surface at a side away from the substrate and a side surface arranged between the bottom surface and the top surface, the cathode is in contact with the side surface of the auxiliary electrode, the organic light emitting block is arranged on a side of the top surface of the auxiliary electrode away from the substrate, and the organic light emitting block is arranged to be isolated from the organic light emitting layer,
    wherein in a direction perpendicular to the display substrate, the auxiliary electrode comprises a first auxiliary electrode, a second auxiliary electrode disposed at one side of the first auxiliary electrode away from the substrate, and a third auxiliary electrode disposed at one side of the second auxiliary electrode away from the substrate, in the direction perpendicular to the display substrate, the first auxiliary electrode, the second auxiliary electrode and the third auxiliary electrode which are stacked form to an "I" shaped structure, the second auxiliary electrode is sandwiched between the first auxiliary electrode and the third auxiliary electrode, an orthographic projection of whole of the second auxiliary electrode, in a plane parallel to the display substrate, on the substrate is within an orthographic projection of whole of the first auxiliary electrode, in the plane parallel to the display substrate, on the substrate, and within an orthographic projection of whole of the third auxiliary electrode, in the plane parallel to the display substrate, on the substrate, wherein the cathode is in direct contact with one side of the organic light emitting block away from the substrate, in direct contact with the second auxiliary electrode and in direct contact with the third auxiliary electrode, wherein the second auxiliary electrode comprises a second side surface, a normal direction of the second side surface is parallel or nearly parallel to a plane of the substrate, the third auxiliary electrode comprises a third lower surface and a third side surface, the third lower surface is protruded from the second auxiliary electrode and at a side close to the substrate; and a normal direction of the third side surface is parallel or nearly parallel to the plane of the substrate, and the organic light emitting block comprises a fourth upper surface at a side away from the substrate and a fourth side surface, a normal direction of the fourth side surface is parallel or nearly parallel to the plane of the substrate; the cathode is in direct contact with the second side surface, the cathode is in direct contact with the third lower surface and the third side surface, and the cathode is in direct contact with the fourth upper surface and the fourth side surface, wherein in a direction parallel to the display substrate, the display substrate comprises a plurality of pixel units, which are arranged sequentially along a first direction and a second direction, respectively, the first direction intersecting the second direction; the plurality of pixel units comprises at least one first pixel unit and a second pixel unit adjacent to the first pixel unit in the first direction; the auxiliary electrode is arranged between the first pixel unit and the second pixel unit, wherein the first pixel unit comprises a first sub-pixel, a second sub-pixel and a third sub-pixel arranged sequentially along the first direction, and the second pixel unit comprises a first sub-pixel, a second sub-pixel and a third sub-pixel arranged sequentially along a direction opposite to the first direction; the auxiliary electrode is arranged between the third sub-pixel of the first pixel unit and the third sub-pixel of the second pixel unit, and wherein the third sub-pixel of the first pixel unit comprises a first anode with a first groove, and the third sub-pixel of the second pixel unit comprises a first anode with a second groove, and the first auxiliary electrode is arranged between the first anode with the first groove and the first anode with the second groove.

13. The display substrate according to claim 2, wherein in the direction perpendicular to the display substrate, the driving circuit layer comprises a first conducting layer, a semiconductor layer, a second conducting layer and a third conducting layer which are disposed sequentially on the substrate, wherein the first conducting layer at least comprises a shielding layer, the semiconductor layer at least comprises a first capacitor polar plate and active layers of a plurality of transistors, the second conducting layer at least comprises gate electrodes of the plurality of transistors, and the third conducting layer at least comprises a second power line, a second capacitor polar plate and first electrodes and second electrodes of the plurality of transistors.

* * * * *